(12) United States Patent  
Sakata et al.

(10) Patent No.: US 9,362,393 B2  
(45) Date of Patent: Jun. 7, 2016

(54) VERTICAL SEMICONDUCTOR DEVICE INCLUDING ELEMENT ACTIVE PORTION AND VOLTAGE WITHSTANDING STRUCTURE PORTION, AND METHOD OF MANUFACTURING THE VERTICAL SEMICONDUCTOR DEVICE

(71) Applicant: FUJI ELECTRIC CO., LTD., Kawasaki-shi (JP)

(72) Inventors: Toshiaki Sakata, Matsumoto (JP); Yasushi Niimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/637,687

(22) Filed: Mar. 4, 2015

(65) Prior Publication Data

US 2015/0303294 A1    Oct. 22, 2015

(30) Foreign Application Priority Data

Apr. 17, 2014  (JP) ................. 2014-085388  
Jul. 2, 2014    (JP) ................. 2014-137005

(51) Int. Cl.  
*H01L 29/78* (2006.01)  
*H01L 29/10* (2006.01)  
(Continued)

(52) U.S. Cl.  
CPC ........ *H01L 29/7802* (2013.01); *H01L 29/0634* (2013.01); *H01L 29/0696* (2013.01);  
(Continued)

(58) Field of Classification Search  
CPC ............ H01L 29/0634; H01L 29/7813; H01L 29/66712; H01L 29/41741; H01L 29/7802; H01L 29/7397; H01L 29/8611; H01L 29/08; H01L 2224/48247; H01L 29/1095; H01L 29/0619; H01L 29/7395; H01L 2924/13062; H01L 29/0615; H01L 29/7827; H01L 21/761; H01L 2224/05082; H01L 2224/05083; H01L 29/66666; H01L 29/0696; H01L 29/402; H01L 29/4238; H01L 29/7805; H01L 29/7811  
USPC ........................... 257/758–766; 438/122, 123  
See application file for complete search history.

(56) References Cited

U.S. PATENT DOCUMENTS 6,498,368 B2   12/2002  Sakamoto et al.  
6,512,268 B1 *  1/2003  Ueno ................. H01L 29/0634  
                                                         257/341  
(Continued)

FOREIGN PATENT DOCUMENTS

EP        0293846 A1    12/1988  
EP        1111685 A1     6/2001  
(Continued)

OTHER PUBLICATIONS

European Search Report issued in counterpart application No. EP15157696.4, dated Sep. 30, 2015.

*Primary Examiner* — Marc Armand  
*Assistant Examiner* — Shannon Yi  
(74) *Attorney, Agent, or Firm* — Rossi, Kimms & McDowell LLP

(57) ABSTRACT

Aspects of the invention are directed to a vertical semiconductor device including an element active portion and a voltage withstanding structure portion that has a first main electrode and a gate pad electrode on a first main surface of the element active portion, includes first parallel pn layers in a drift layer below the first main electrode, and includes second parallel pn layers below the gate pad electrode. The vertical semiconductor device includes a first conductivity type isolation region between the second parallel pn layers below the gate pad electrode and a p-type well region disposed in a surface layer of the drift layer, and by the repetition pitch of the second parallel pn layers being shorter than the repetition pitch of the first parallel pn layers, it is possible to obtain low on-state resistance, high avalanche withstand, high turn-off withstand, and high reverse recovery withstand.

27 Claims, 29 Drawing Sheets

(51) Int. Cl.
*H01L 29/08* (2006.01)
*H01L 29/66* (2006.01)
*H01L 29/423* (2006.01)
*H01L 29/06* (2006.01)

(52) U.S. Cl.
CPC ........ *H01L29/0869* (2013.01); *H01L 29/0878* (2013.01); *H01L 29/1045* (2013.01); *H01L 29/4238* (2013.01); *H01L 29/66712* (2013.01); *H01L 29/66734* (2013.01); *H01L 29/7811* (2013.01); *H01L 29/7813* (2013.01); *H01L 29/1095* (2013.01)

(56) References Cited

U.S. PATENT DOCUMENTS

| | | | |
|---|---|---|---|
| 2001/0028083 A1* | 10/2001 | Onishi | H01L 29/0634 257/328 |
| 2002/0167020 A1* | 11/2002 | Iwamoto | H01L 29/7802 257/110 |
| 2003/0052329 A1* | 3/2003 | Kobayashi | H01L 29/0619 257/135 |
| 2008/0246079 A1 | 10/2008 | Saito et al. | |
| 2012/0126315 A1* | 5/2012 | Onishi | H01L 29/0634 257/329 |
| 2012/0217555 A1 | 8/2012 | Saito et al. | |
| 2013/0126967 A1 | 5/2013 | Toyoda et al. | |
| 2014/0183627 A1* | 7/2014 | Ma | H01L 27/0255 257/334 |
| 2014/0197477 A1* | 7/2014 | Onishi | H01L 29/7811 257/329 |

FOREIGN PATENT DOCUMENTS

| | | |
|---|---|---|
| JP | 2001298191 A | 10/2001 |
| JP | 2005150348 A | 6/2005 |
| JP | 2009099911 A | 5/2009 |
| WO | 2011013379 A1 | 2/2011 |

\* cited by examiner

VERTICAL SEMICONDUCTOR DEVICE INCLUDING ELEMENT ACTIVE PORTION AND VOLTAGE WITHSTANDING STRUCTURE PORTION, AND METHOD OF MANUFACTURING THE VERTICAL SEMICONDUCTOR DEVICE

CROSS-REFERENCE TO RELATED APPLICATIONS

This application is based on, and claims priority to, Japanese Patent Application No. 2014-085388, filed on Apr. 17, 2014, and Japanese Patent Application No. 2014-137005, filed on Jul. 2, 2014. The disclosures of the priority applications, in their entirety, including the drawings, claims, and the specifications thereof, are incorporated herein by reference.

BACKGROUND OF THE INVENTION

1. Field of the Invention

Embodiments of the invention relate to vertical semiconductor devices having high breakdown voltages.

2. Description of the Related Art

In general, semiconductor devices are of a lateral type, having an electrode portion on one surface, or a vertical type, having an electrode on both surfaces. A vertical semiconductor device is such that the direction in which a drift current flows when in an on-state and the direction in which a depletion layer caused by reverse bias voltage extends when in an off-state are the same. For example, in the case of a normal planar type n-channel vertical MOSFET, a high resistance $n^-$-type drift layer works as a region that causes a drift current to flow in a vertical direction when the MOSFET is in an on-state, and depletes when the MOSFET is in an off-state, thereby working to increase breakdown voltage. By the thickness of the high resistance $n^-$-type drift layer being reduced, thus shortening the current path, drift resistance decreases. Consequently, there is an advantage in that the actual on-state resistance of the MOSFET is reduced. On the other hand, however, the spread of the depletion layer spreading in the $n^-$-type drift region narrows, because of which breakdown voltage decreases.

Meanwhile, a semiconductor device with high breakdown voltage is such that it is necessary to thicken the $n^-$-type drift layer in order to maintain the breakdown voltage. Therefore, on-state resistance rises, and on-state loss increases. In this way, on-state resistance and breakdown voltage are in a trade-off relationship.

It is known that this trade-off relationship is established in a vertical semiconductor device such as an IGBT, bipolar transistor, or diode. Also, this trade-off relationship is the same in the case of a lateral semiconductor device. A vertical semiconductor device with a superjunction structure having a drift layer configured of parallel pn layers, wherein an n-type region with an increased impurity concentration and a p-type region are disposed alternately, is known as a method of improving the trade-off relationship.

FIGS. 25A and 25B show a plan view and sectional view of an existing vertical semiconductor device 500 having a superjunction structure. FIG. 25A shows one portion of a plan view, while FIG. 25B is a sectional view along X-X' of FIG. 25A. Herein, a case is shown wherein the widths of parallel pn layers 60 disposed under a source pad electrode 56 and under a gate pad electrode 57 are the same.

The vertical semiconductor device 500 includes an active region 53 and a voltage withstanding structure region 52 disposed in a peripheral portion outside the active region 53. A gate pad region 54 (inside the two-dot chain line shown in FIG. 25A) is disposed in the active region 53. P-type well regions 55 are disposed in the active region 53, and a source pad electrode 56 is disposed on the upper surfaces of the p-type well regions 55 of the active region 53 other than in the gate pad region 54. The p-type well regions 55 are formed so as to enclose the active region 53 in an outer peripheral end inside the active region 53, and a gate runner 58 connected to the gate pad electrode 57 is disposed on the upper surfaces of the p-type well regions 55.

The planar form of a gate electrode 59 disposed under the source pad electrode 56 is a stripe form extending in a direction Q of FIG. 25A, and is disposed extending to the whole of a region under the gate pad electrode 57. The direction Q of FIG. 25A indicates a direction vertical to the direction in which a p-type partition region 60a and n-type drift region 60b of the parallel pn layers 60, to be described hereafter, are repeatedly alternately disposed.

The p-type well region 55 is disposed in a surface layer of a first $n^-$-type drift region 69 under the source pad electrode 56 and under the gate pad electrode 57. An $n^+$-type source region 61 and $p^+$-type contact region 62 are disposed in a surface layer of the p-type well region 55. The p-type partition region 60a is disposed in contact with the p-type well region 55 under the p-type well region 55. The gate electrode 59 is disposed across a gate insulating film 68 on the p-type well region 55 sandwiched between the $n^+$-type source region 61 and first $n^-$-type drift region 69. The gate electrode 59 is also disposed extending under the gate pad electrode 57. The $n^+$-type source region 61 and $p^+$-type contact region 62 under the source pad electrode 56 are connected to the source pad electrode 56 disposed above. Also, the gate electrode 59 under the source pad electrode 56 is electrically isolated from the source pad electrode 56 by an interlayer dielectric 64, and an outer peripheral portion thereof is connected via a contact hole 65 to the gate runner 58.

As previously described, MOS structures J of the same dimensions are formed inside the active region 53 and inside the gate pad region 54, and the p-type partition region 60a connected to the p-type well region 55 is formed under the p-type well region 55. The width of the p-type partition region 60a is the same below the source pad electrode 56 and below the gate pad electrode 57. Dotted lines parallel to the direction Q shown in FIG. 25A are lines schematically showing the gate electrode 59. The MOS structure of the J portion is configured of the p-type well region 55, $n^+$-type source region 61, gate insulating film 68, and gate electrode 59.

The $n^+$-type source region 61 and $p^+$-type contact region 62 under the gate pad electrode 57 extend in the direction Q of FIG. 25A, and are connected to the source pad electrode 56.

The vertical semiconductor device 500 is such that the drift layer is not configured uniformly of a single conductivity type, but rather is configured of the plurality of parallel pn layers 60 wherein the vertical layer form n-type drift region 60b (n-type column) and vertical layer form p-type partition region 60a (p-type column) are alternately repeatedly joined.

By increasing the impurity concentration of the n-type drift region 60b configuring the parallel pn layers 60, thus reducing the on-state resistance and achieving charge balance of the n-type drift region 60b and p-type partition region 60a, it is possible to cause the whole of the parallel pn layers 60 to deplete, thus increasing breakdown voltage. Because of this, it is possible to improve the trade-off relationship. Achieving charge balance means determining each impurity concentration so that the width of the depletion layer spreading inside the n-type drift region 60b and the width of the depletion layer spreading inside the p-type partition region 60a are the same, whereby the whole of the parallel pn layers 60 depletes at a rated voltage or less.

In Japanese Patent Application Publication No. JP-A-2009-99911 (also referred to herein as "JP-A-2009-99911"), it is described that, in order to suppress the generation of avalanche carriers under the gate pad electrode, thus achieving a reduction in on-state resistance, a MOS structure portion is formed immediately below the gate pad electrode, and the impurity concentration of the n-type column and p-type column is lower than that under the source electrode.

Also, in Japanese Patent Application Publication No. JP-A-2001-298191 (also referred to herein as "JP-A-2001-298191"), it is described that, in order to suppress avalanche breakdown in a portion immediately below the gate pad electrode, thus maintaining stable breakdown voltage, a p-type well region is included immediately below the gate pad electrode, the pitch of parallel pn layers connected to the p-type well region under the p-type well region is shorter than in the active region, and the impurity concentration is lower than in the active region.

A vertical semiconductor device having this superjunction structure is such that an end portion of the p-n junction of the parallel pn layers is connected to the p-type well region, because of which a good charge balance is obtained, and dynamic avalanche breakdown, which is liable to occur when turning off, is unlikely to occur.

Also, in Japanese Patent Application Publication No. JP-A-2005-150348 (also referred to herein as "JP-A-2005-150348"), it is described that in a planar type semiconductor device, a MOSFET cell structure is also formed under the gate pad electrode.

FIGS. 26 and 27 show the flow of carriers (electrons 74) when turning off the vertical semiconductor device 500 shown in FIGS. 25A and 25B.

FIG. 26 is a diagram showing the flow of the electrons 74 in an on-state before entering a turn-off operation. In the on-state, electrons 74 flowing out from the source pad electrode 56 to the $n^+$-type source region 61 are implanted through a channel inversion layer 67 into the first $n^-$-type drift region 69, and flow via the n-type drift region 60b into an $n^+$-type drain region 71. At this time, electrons 74 flowing out from the $n^+$-type source region 61 in a peripheral portion of the active region 53 are prevented in the p-type partition region 60a immediately below the gate pad electrode 57 from spreading in the direction in which the p-type partition region 60a and n-type drift region 60b of the parallel pn layers 60 are alternately repeated (the lateral direction of a dotted arrow in the drawing). Because of this, a vertical semiconductor device wherein the parallel pn layers 60 are not formed in the drift layer is such that on-state resistance is higher than when the flow of the electrons 74 spreads in the same direction (dotted arrows in the drawing) as the direction in which the parallel pn layers 60 are repeated (shown by a lateral dotted arrow in the drawing), and the trade-off relationship between the on-state resistance and breakdown voltage is not necessarily a preferred relationship.

FIG. 27 is a diagram showing a state wherein a shift is made to a turn-off operation, and the voltage rises. A depletion layer 81 indicated by dotted lines begins to spread from a p-n junction 80, indicated by a heavy line (herein, the heavy line shows only one place), configured of the p-type well region 55 and p-type partition region 60a and the first $n^-$-type drift region 69, second $n^-$-type drift region 72, and n-type drift region 60b. Electrons 74 left by the depletion layer 81 are swept out to the $n^+$-type drain region 71.

When the current density during the turn-off operation is high at, for example, 100 A/cm$^2$, and the electrical field intensity inside the depletion layer 81 in this state increases, dynamic avalanche occurs. Holes 83 generated in large quantity by the dynamic avalanche flow through the p-type well region 55 and $p^+$-type contact region 62 into the source pad electrode 56. However, holes 83 infiltrating the p-type well region 55 and $p^+$-type contact region 62 under the gate pad electrode 57 move a long distance to the source pad electrode 56, which is in the direction Q. Because of this, the potentials of the p-type well region 55 and $p^+$-type contact region 62 under the center of the gate pad electrode 57 rise due to direction Q resistance R of the p-type well region 55 and $p^+$-type contact region 62, and there is false firing of a parasitic npn transistor configured of the $n^+$-type source region 61, p-type well region 55, and n-type drift region 60b of a portion E. A large amount of follow current flows due to the false firing, causing destruction. That is, turn-off (dynamic avalanche) withstand decreases. Meanwhile, as holes 83 flowing into the p-type well region 55 and $p^+$-type contact region 62 under the source pad electrode 56 are pulled out by the source pad electrode 56 immediately above the $p^+$-type contact region 62, this phenomenon does not occur.

Also, holes 83 generated inside the depletion layer 81 exhibit the same behavior in the case of a static avalanche too, causing avalanche withstand under the gate pad electrode 57 to decrease.

FIGS. 28 and 29 are diagrams showing a reverse recovery phenomenon of the parasitic diode of the vertical semiconductor device 500 of FIGS. 25A and 25B. FIG. 28 shows a state wherein forward current is flowing through the parasitic diode. FIG. 29 shows a state wherein reverse recovery of the parasitic diode is occurring.

In FIG. 28, holes 83 implanted from the source pad electrode 56 into the p-type well region 55 flow into the second $n^-$-type drift region 72 through the p-n junction 80 configured of the p-type well region 55 and p-type partition region 60a and the first $n^-$-type drift region 69, second $n^-$-type drift region 72, and n-type drift region 60b. Meanwhile, electrons 74 implanted from the $n^+$-type drain region 71 into the second $n^-$-type drift region 72 flow into the p-type partition region 60a through the n-type drift region 60b. Due to the holes 83 and electrons 74, conductivity modulation occurs in the parallel pn layers 60 (inside a circle 90), and excess carriers accumulate.

In FIG. 29, the depletion layer 81 spreads from the p-n junction 80 when reverse recovery occurs, and excess holes 83 are swept out to the source pad electrode 56 via the p-type well region 55 and $p^+$-type contact region 62. Meanwhile, excess electrons 74 are swept out to the drain electrode 73 via the $n^+$-type drain region 71. When the electrical field intensity inside the depletion layer 81 increases in a state wherein a large number of carriers exist, dynamic avalanche occurs. A large number of holes 83 generated by the dynamic avalanche under the gate pad electrode 57 flow to the source pad electrode 56, which is in the direction Q. Thereupon, as illustrated in FIG. 27, there is false firing of the parasitic npn transistor of the portion E under the gate pad electrode 57. Because of this, dynamic avalanche withstand decreases.

It is supposed that the phenomena illustrated in FIGS. 26 to 29 also occur in JP-A-2009-99911 and JP-A-2001-298191. Also, in JP-A-2005-150348, the element is a planar type element, not a superjunction type element. Also, by the region immediately below the gate pad electrode being an active region, it is possible to reduce on-state resistance, but when using only this method, the current path is limited to the direction in which the p-type well region extends. Because of this, there is a problem in that the current density increases at the termination of the $n^+$-type source region (the place in which the $n^+$-type source region is connected to the source electrode disposed opposing the gate pad electrode) immediately below the gate pad electrode when turning off, the electrical field intensity inside the depletion layer increases, and dynamic avalanche is liable to occur.

Thus, as is described above, certain shortcomings exist in the related art.

SUMMARY OF THE INVENTION

Embodiments of the invention are directed to these and other shortcomings. Embodiments of the invention provide a vertical semiconductor device, and a method of manufacturing the vertical semiconductor device, such that it is possible to resolve the heretofore described problems, and obtain high avalanche withstand, high turn-off withstand, and high reverse recovery withstand.

In embodiments of the invention, a semiconductor device of the invention is a vertical semiconductor device including an element active portion and a voltage withstanding structure portion, the element active portion including a first conductivity type first semiconductor layer, a drift layer disposed on a first main surface of the first semiconductor layer, a first conductivity type second semiconductor layer disposed in a surface layer of the drift layer, a second conductivity type well region disposed in a surface layer of the second semiconductor layer, a first conductivity type source region disposed in a surface layer of the well region, a second conductivity type contact region disposed in a surface layer of the well region, a gate electrode disposed across a gate insulating film above the well region sandwiched between the source region of the well region and the second semiconductor layer, an interlayer dielectric disposed on the upper surface of the gate electrode, a first main electrode electrically connected to the source region and contact region on the upper surface of the interlayer dielectric, and a gate pad electrode, to which the gate electrode is electrically connected, disposed separated from the first main electrode on the upper surface of the interlayer dielectric. The drift layer below the first main electrode includes first parallel pn layers wherein a first first conductivity type semiconductor region and first second conductivity type semiconductor region are repeatedly alternately disposed in a direction parallel to the first main surface and the first second conductivity type semiconductor region is in contact with the well region, the drift layer below the gate pad electrode includes second parallel pn layers wherein a second first conductivity type semiconductor region and second second conductivity type semiconductor region are repeatedly alternately disposed in a direction parallel to the first main surface and the second second conductivity type semiconductor region is disposed so as to oppose the well region, and a first conductivity type isolation region is included between the second parallel pn layers and the well region.

Also, embodiments of the invention include a vertical semiconductor device including an element active portion and a voltage withstanding structure portion, the element active portion including a first conductivity type first semiconductor layer, a drift layer disposed on a first main surface of the first semiconductor layer, a second conductivity type well region disposed in a surface layer of the drift layer, a first conductivity type source region disposed in a surface layer of the well region, a second conductivity type contact region disposed in a surface layer of the well region, a trench disposed in a surface layer of the well region, a gate electrode disposed across a gate insulating film in the trench, an interlayer dielectric disposed on the upper surface of the gate electrode, a first main electrode electrically connected to the source region and contact region on the upper surface of the interlayer dielectric, and a gate pad electrode, to which the gate electrode is electrically connected, disposed separated from the first main electrode on the upper surface of the interlayer dielectric. The drift layer below the first main electrode includes first parallel pn layers wherein a first first conductivity type semiconductor region and first second conductivity type semiconductor region are repeatedly alternately disposed in a direction parallel to the first main surface and the first second conductivity type semiconductor region is in contact with the well region, the drift layer below the gate pad electrode includes second parallel pn layers wherein a second first conductivity type semiconductor region and second second conductivity type semiconductor region are repeatedly alternately disposed in a direction parallel to the first main surface and the second second conductivity type semiconductor region is disposed so as to oppose the well region, a first conductivity type isolation region is included between the second parallel pn layers and the well region, and the trench reaches the first first conductivity type semiconductor region and the first conductivity type isolation region.

Also, in embodiments of the invention, a method of manufacturing the vertical semiconductor device includes a step of epitaxially growing a first conductivity type low resistance layer on a first main surface of a first conductivity type semiconductor substrate and selectively ion implanting a first conductivity type impurity and second conductivity type impurity into the surface of the first conductivity type low resistance layer, and a stacking step of repeating multiple times a layer formation step of epitaxially growing a first conductivity type epitaxial layer on the surface of the first conductivity type low resistance layer and selectively ion implanting the first conductivity type impurity and second conductivity type impurity into the surface of the first conductivity type epitaxial layer, and a step of epitaxially growing the first conductivity type epitaxial layer on the surface of the first conductivity type epitaxial layer and selectively ion implanting the first conductivity type impurity and second conductivity type impurity into the surface of the first conductivity type epitaxial layer, wherein there is no selective ion implantation of the first conductivity type impurity and second conductivity type impurity in the stacking step into a place in which the first conductivity type isolation region is formed.

According to embodiments of the invention, a vertical semiconductor device, and a method of manufacturing the vertical semiconductor device, such that it is possible to obtain high avalanche withstand, high turn-off withstand, and high reverse recovery withstand are provided.

DETAILED DESCRIPTION

Hereafter, a description will be given, based on the drawings, of embodiments of the invention. In the following embodiments, a first conductivity type is an n-type and a second conductivity type a p-type, but the first conductivity type may equally well be a p-type and the second conductivity type an n-type. FIGS. 1 to 8B show a first embodiment of the invention.

Figure 1:
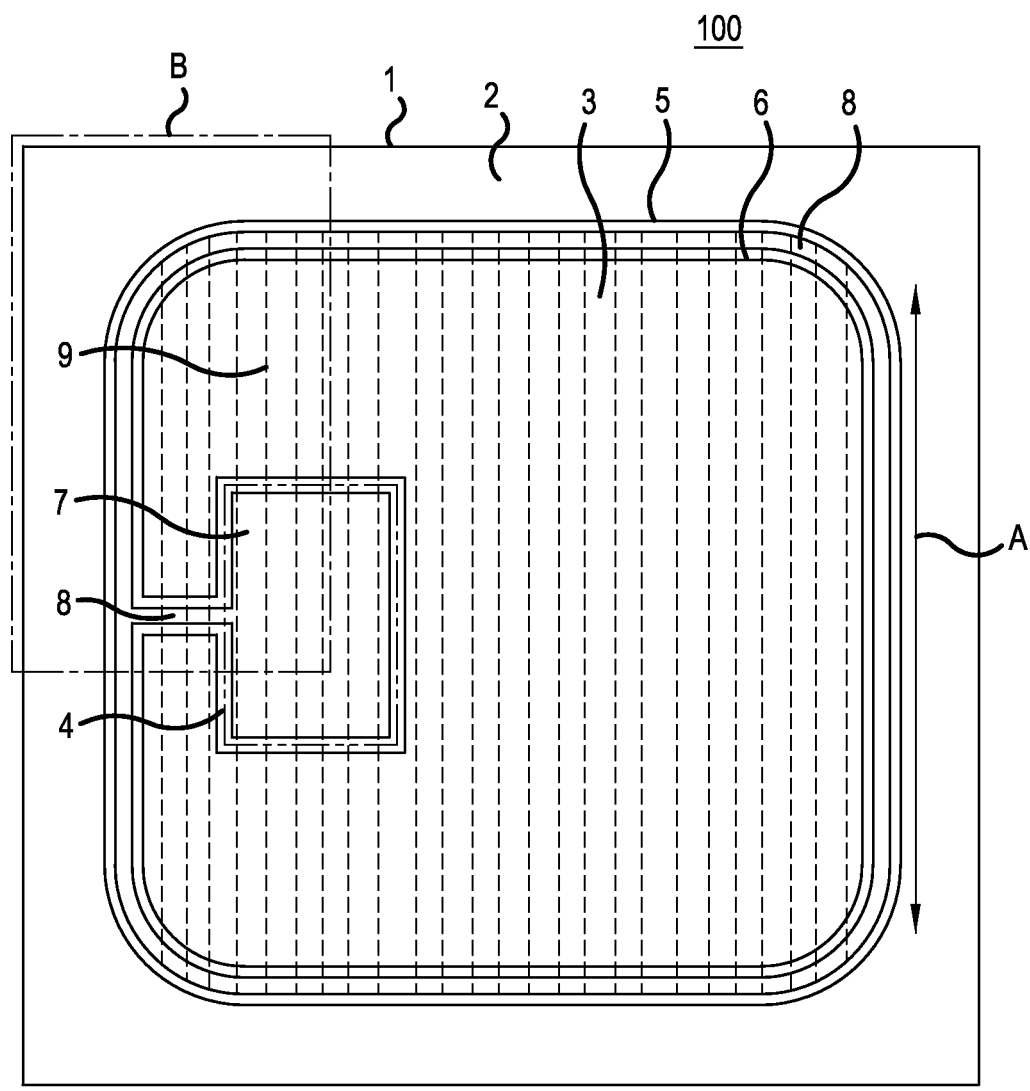
FIG. 1 shows a plan view according to an embodiment of the invention.

As shown in FIG. 1, the vertical semiconductor device 100 includes an active region 3 and a voltage withstanding structure region 2 disposed so as to enclose the active region 3. A gate pad region 4 (inside the two-dot chain line) is disposed inside the active region 3.

Parallel pn layers, not shown in the drawing, are disposed in the voltage withstanding structure region 2. Also, a guard ring structure, RESURF structure, field plate structure, and the like, not shown in the drawing, are disposed in the voltage withstanding structure region 2.

The dotted lines of FIG. 1 indicate gate electrodes 9, to be described hereafter. The gate electrodes 9 are formed in stripe form inside the active region 3.

Figure 2A:
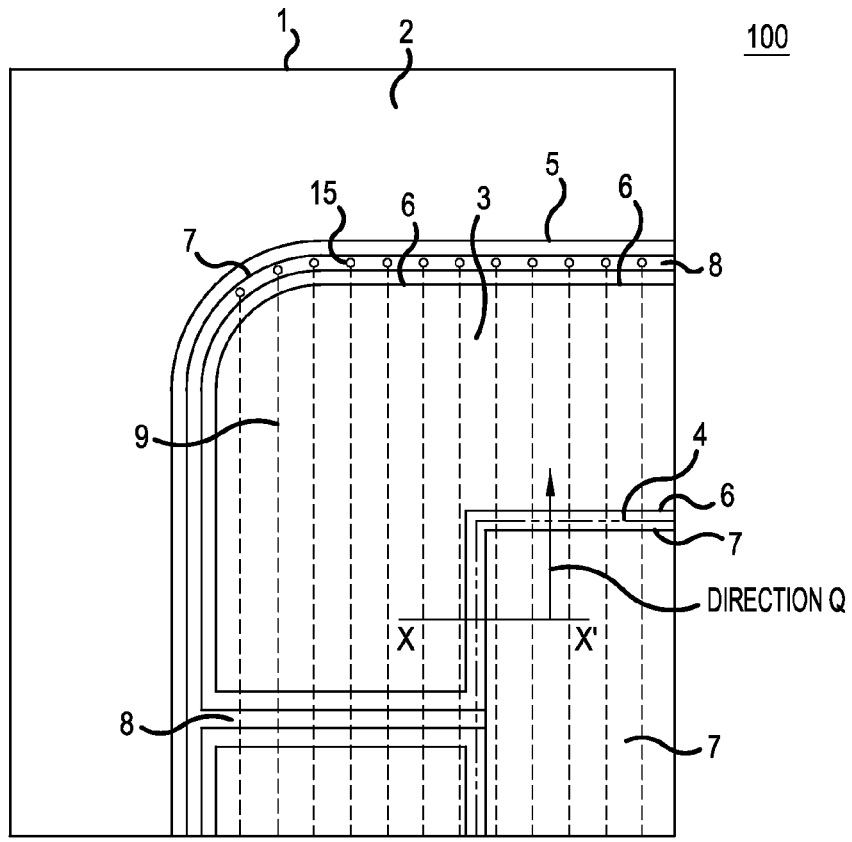
FIGS. 2A and 2B are an enlargement of a portion B of FIG. 1 according to the embodiment of the invention and a sectional view along X-X'.

As shown in FIG. 2A, a p-type well region 5 is disposed in the active region 3, a source pad electrode 6 and gate pad region 4 are disposed on the upper surface of the p-type well region 5, and a gate pad electrode 7 is disposed inside the gate pad region 4. The periphery of the gate pad region 4 is enclosed by the source pad electrode 6.

The source pad electrode 6 and gate pad electrode 7 indicate an electrode forming a source pad and an electrode forming a gate pad, and these electrodes are formed of an aluminum alloy layer.

A gate runner 8 is disposed on an outer peripheral end inside the active region 3, and connected to the gate pad electrode 7. The gate runner 8 is disposed on the upper surface of an interlayer dielectric 14 so as to enclose the p-type well region 5 inside the active region 3, and is connected to the gate pad electrode 7. Also, the gate runner 8 is electrically connected to end portions of the gate electrodes 9 (leading end portions of the dotted lines shown in FIG. 2A) via contact holes 15 opened in the interlayer dielectric 14.

In order to obtain good breakdown voltage, it is good when the gate runner 8 completely encloses the p-type well region 5. However, it may happen that one portion of the gate runner 8 of a portion A shown in FIG. 1, parallel to the stripe form gate electrodes, is missing.

Figure 2B:
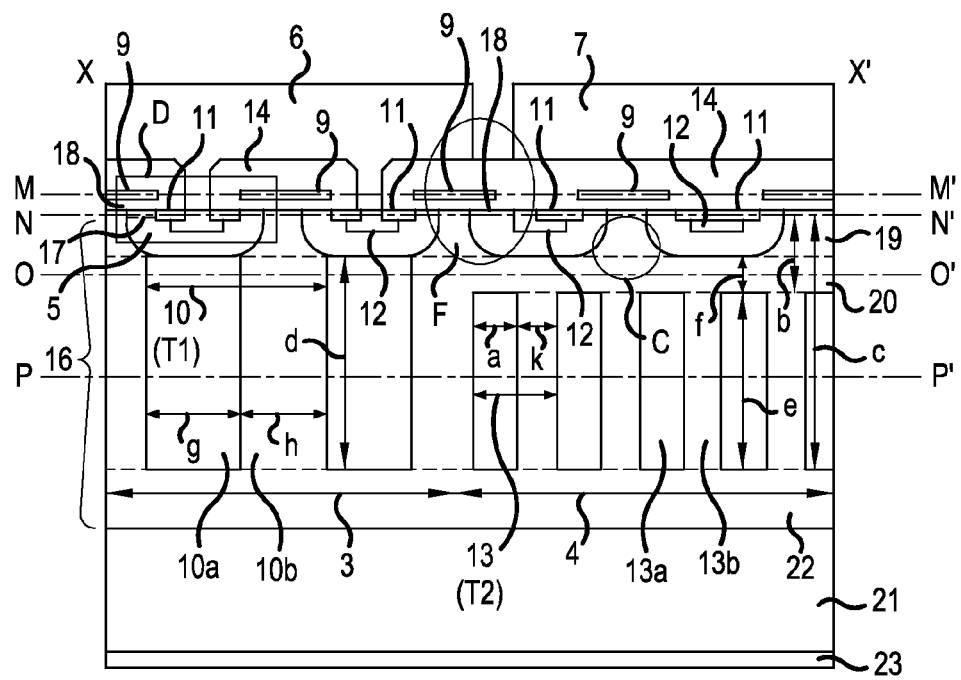

As shown in FIG. 2B, a drift region 16 is disposed on a main surface of an $n^+$-type drain region 21. A second $n^-$-type drift region 22 is disposed on the main surface of the $n^+$-type drain region 21 in the drift region 16. An n-type drift region 10b is disposed on the upper surface of the second $n^-$-type drift region 22, and a first $n^-$-type drift region 19 is disposed on the upper surface of the n-type drift region 10b. A plurality of the p-type well region 5 are disposed separated in a surface layer of the first $n^-$-type drift region 19. A drain electrode 23 is disposed on the other main surface of the $n^+$-type drain region 21.

An $n^+$-type source region 11 is disposed in a surface layer of the p-type well region 5, and a $p^+$-type contact region 12 is disposed so as to be in contact with the $n^+$-type source region 11. The gate electrode 9 is disposed on the upper surface of the p-type well region 5 across a gate insulating film 18 above the first $n^-$-type drift region 19 sandwiched between the $n^+$-type source regions 11 of neighboring p-type well regions 5 and the p-type well region 5. The interlayer dielectric 14 is disposed on the upper surface of the gate electrode 9. The source pad electrode 6, electrically connected to the $n^+$-type source region 11 and $p^+$-type contact region 12, is disposed on the upper surface of the interlayer dielectric 14. Also, the gate pad electrode 7, electrically isolated from the source pad electrode 6, is disposed on the upper surface of the interlayer dielectric 14. The gate pad electrode 7 is electrically connected to the gate electrode 9 via the contact hole 15 disposed in the interlayer dielectric 14. The heretofore described gate structure is a planar type.

The planar form of the gate electrode 9 is a stripe form extending in a direction (a direction Q in FIG. 2A) perpendicular to the direction in which a first p-type partition region 10a and the first n-type drift region 10b of first parallel pn layers 10, to be described hereafter, are repeatedly alternately disposed.

The first parallel pn layers 10, wherein the first p-type partition region 10a and first n-type drift region 10b are repeatedly alternately disposed in a direction parallel to a main surface of the second n⁻-type drift region 22, are disposed in the drift region 16 below the source pad electrode 6. The planar form of the first parallel pn layers 10 is a stripe form extending in a direction (the direction Q in FIG. 2A) perpendicular to the direction in which the first p-type partition region 10a and first n-type drift region 10b are repeatedly alternately disposed. The first p-type partition region 10a is in contact with the p-type well region 5 disposed in a surface layer of the drift region 16.

Second parallel pn layers 13, wherein a second p-type partition region 13a and second n-type drift region 13b are repeatedly alternately disposed in a direction parallel to the upper surface of the second n⁻-type drift region 22, are disposed in the drift region 16 below the gate pad electrode 7. An n⁻-type isolation region 20 is disposed between the p-type well region 5 disposed in the drift region below the gate pad electrode 7 and the second parallel pn layers 13. The second p-type partition region 13a of the second parallel pn layers 13 is disposed so as to oppose the p-type well region 5.

A repetition pitch T2 of the second p-type partition region 13a and second n-type drift region 13b of the second parallel pn layers 13 is shorter than a repetition pitch T1 of the first p-type partition region 10a and first n-type drift region 10b of the first parallel pn layers 10. Also, as shown in FIG. 2B, a length that is a thickness f of the n⁻-type isolation region 20 added to a length e of the second parallel pn layers 13 is a length d of the first parallel pn layers 10. Consequently, the first parallel pn layers 10 are longer than the second parallel pn layers 13.

Although the n⁺-type source region 11 below the gate pad electrode 7 is assumed to be a single n⁺-type source region 11, a plurality of the n⁺-type source region 11 may be formed inside one p-type well region 5, and the p⁺-type contact region 12 may be disposed so as to be in contact between the plurality of the n⁺-type source region 11, as in a MOS portion shown in a portion D of FIG. 2B. Also, the planar form of the n⁺-type source region 11, p⁺-type contact region 12, p-type well region 5, and gate electrode 9 disposed under the gate pad electrode 7 is a stripe form extending in a direction (the direction Q in FIG. 2A) perpendicular to the direction in which the first p-type partition region 10a and first n-type drift region 10b of the first parallel pn layers 10 are repeatedly alternately disposed.

Owing to the previously described repetition pitch T2 of the second parallel pn layers 13 being shorter than the repetition pitch of the first parallel pn layers 10, a depletion layer inside the second parallel pn layers 13 spreads easily. Therefore, an electrical field in an end portion (a portion C in FIG. 2B) between neighboring p-type well regions 5 below the gate pad electrode 7 is relaxed, and electrical field concentration is unlikely to occur. Because of this, it is possible to achieve improvement in characteristics such as high avalanche withstand, high turn-off withstand, and high reverse recovery withstand, and increasing breakdown voltage is also easy.

Next, a description will be given of an example of the vertical semiconductor device 100 having a 600V class voltage rating. The length d of the first parallel pn layers 10 configuring the drift region 16 shown in FIG. 2B is in the region of, for example, 44.0 μm, while a width g of the first p-type partition region 10a configuring the first parallel pn layers 10 and a width h of the first n-type drift region 10b are each in the region of, for example, 6.0 μm. The repetition pitch T1 (g+h) of the first parallel pn layers 10 is in the region of 12.0 μm.

A width a of the second p-type partition region 13a configuring the second parallel pn layers 13 below the gate pad electrode 7, and a width k of the second n-type drift region 13b, are each in the region of, for example, 4.0 μm. The repetition pitch T2 (a+k) of the second parallel pn layers 13 is in the region of, for example, 8.0 μm.

Although not shown in the drawings, the width of a third p-type partition region of unshown third parallel pn layers disposed in the voltage withstanding structure region 2 in a portion on the outer periphery of the active region 3, and the width of a third n-type drift region, are in the region of, for example, 4.0 μm, while the repetition pitch of the third parallel pn layers is in the region of 8.0 μm.

A thickness b of the first n⁻-type drift region 19 and n⁻-type isolation region 20 combined is in the region of, for example, 5.0 μm. The diffusion depth of the p-type well region 5 is in the region of, for example, 3.0 μm. Also, the impurity concentration at the surface of the p-type well region 5 is in the region of, for example, $3.0 \times 10^{17}$ cm⁻³. The diffusion depth of the n⁺-type source region 11 is in the region of, for example, 1.0 μm, while the surface impurity concentration is in the region of, for example, $3.0 \times 10^{20}$ cm⁻³.

The thickness of the first n⁻-type drift region 19 is in the region of, for example, 8.0 μm, while the impurity concentration of the first n⁻-type drift region 19 is in the region of, for example, $2.0 \times 10^{14}$ cm⁻³.

A thickness f of the n⁻-type isolation region 20 is in the region of, for example, 2.5 μm. Also, the impurity concentration of the n⁻-type isolation region 20 is in the region of, for example, $2.0 \times 10^{16}$ cm⁻³.

The thickness of the second n⁻-type drift region 22 is in the region of, for example, 2.5 μm. Also, the impurity concentration of the second n⁻-type drift region 22 is in the region of, for example, $2.0 \times 10^{16}$ cm⁻³.

The thickness of the n⁺-type drain region 21 is in the region of, for example, 200 μm. Also, the impurity concentration of the n⁺-type drain region 21 is in the region of, for example, $2.0 \times 10^{18}$ cm⁻³.

In FIG. 2B, it is good when the thickness b (the distance from the surface of the first n⁻-type drift region 19 to the upper end of the second parallel pn layers 13), which is the total of the thickness of the first n⁻-type drift region 19 and the thickness of the n⁻-type isolation region 20, is one-third or less of a distance c from the surface of the first n⁻-type drift region 19 to the lower end of the second parallel pn layers 13 (this is a length that is the total of the thickness b, which is the total of the thickness of the first n⁻-type drift region 19 and the thickness of the n⁻-type isolation region 20, and the length e of the second parallel pn layers 13). In this way, it is possible to achieve charge balance of the second parallel pn layers 13. This means that when the length e of the second parallel pn layers 13 is shorter, it is more difficult to achieve charge balance.

Also, when the thickness b, which is the total of the thickness of the first n⁻-type drift region 19 and the thickness of the n⁻-type isolation region 20, is too small, the thickness f of the n⁻-type isolation region 20 also decreases, there is a decrease in the width of a current path in a direction parallel to the direction in which the second p-type partition region 13a and second n-type drift region 13b of the second parallel pn layers 13 are repeatedly alternately aligned, and on-state resistance increases. Because of this, the thickness b is equal to or greater than the width k of the second n-type drift region 13b of the second parallel pn layers 13. Furthermore, by the impurity concentration of the n⁻-type isolation region 20 being lower than that of the second parallel pn layers 13, a depletion layer can reach the second parallel pn layers 13 at a low voltage. According to these advantages, it is possible to achieve an increase in avalanche withstand and an increase in breakdown voltage.

The impurity concentration distributions of the first parallel pn layers 10 and second parallel pn layers 13 are such that the first p-type partition region 10a and second p-type partition region 13a are P-rich (meaning that the p-type impurity concentration is high) on the side nearer the surface (the upper side in the drawing), while the first n-type drift region 10b and second n-type drift region 13b are N-rich on the side nearer the n⁺-type drain region 21 (the lower side in the drawing). By applying concentration bias in this way, the spread of the depletion layer when turning off is slower on the surface side in the first p-type partition region 10a and second p-type partition region 13a, and on the n⁺-type drain region 21 side in the first n-type drift region 10b and second n-type drift region 13b, compared with when there is no concentration bias, and carrier residue is unlikely to occur. Because of this, time is taken for carriers (residual electrons and electrons and holes generated in the depletion layer) to be swept out to the source pad electrode 6 and n⁺-type drain region 21, because of which no carriers are left behind. Specifically, an advantage is obtained when the concentration bias is such that, for example, the higher concentration is 1.5 times or more greater than the lower concentration. However, as the charge balance of the first p-type partition region 10a and second p-type partition region 13a, and of the first n-type drift region 10b and second n-type drift region 13b, breaks down locally when the concentration bias is large, it is good when the concentration bias is two times or less.

As a result of this, dynamic avalanche breakdown becomes even less likely to occur, and it is possible for the vertical semiconductor device 100 to have still higher turn-off withstand and reverse recovery withstand.

Figure 3:
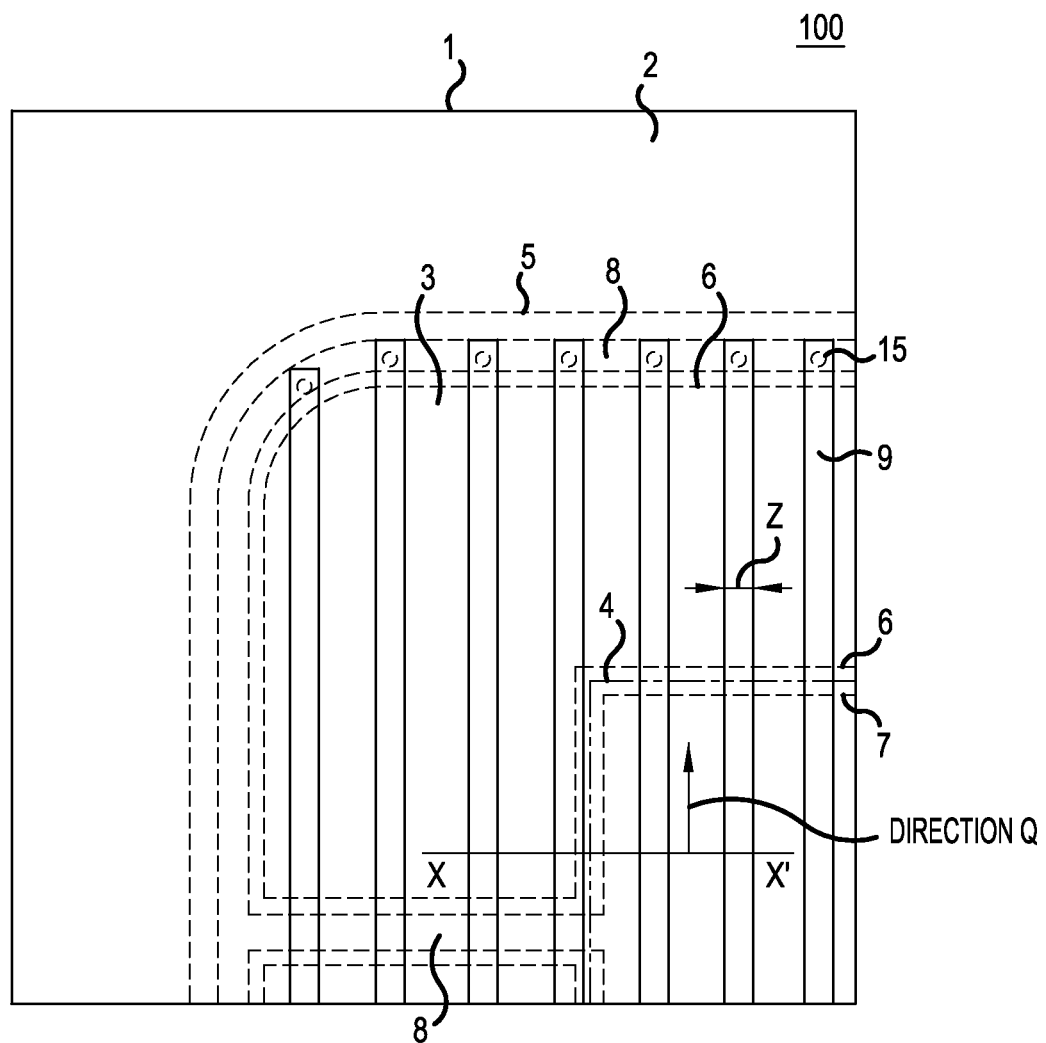
FIG. 3 is a sectional view along M-M' of FIG. 2B according to the embodiment of the invention.

FIG. 3 shows a sectional view along M-M' of FIG. 2B. The planar form of the gate electrode 9 disposed under the source pad electrode 6 is a stripe form extending in a direction (the direction Q in FIG. 2A) perpendicular to the direction in which the first p-type partition region 10a and first n-type drift region 10b of the first parallel pn layers 10 are repeatedly alternately disposed. The gate electrode 9 under the gate pad electrode 7 and the gate electrode 9 under the source pad electrode 6 are electrically connected. Widths Z of the gate electrodes 9 under the source pad electrode 6 and gate pad electrode 7 are equal.

Dotted lines inside the gate electrodes 9 in the drawing indicate the positions of the contact holes 15 disposed in the interlayer dielectric 14 shown in FIG. 2B.

Figure 4:
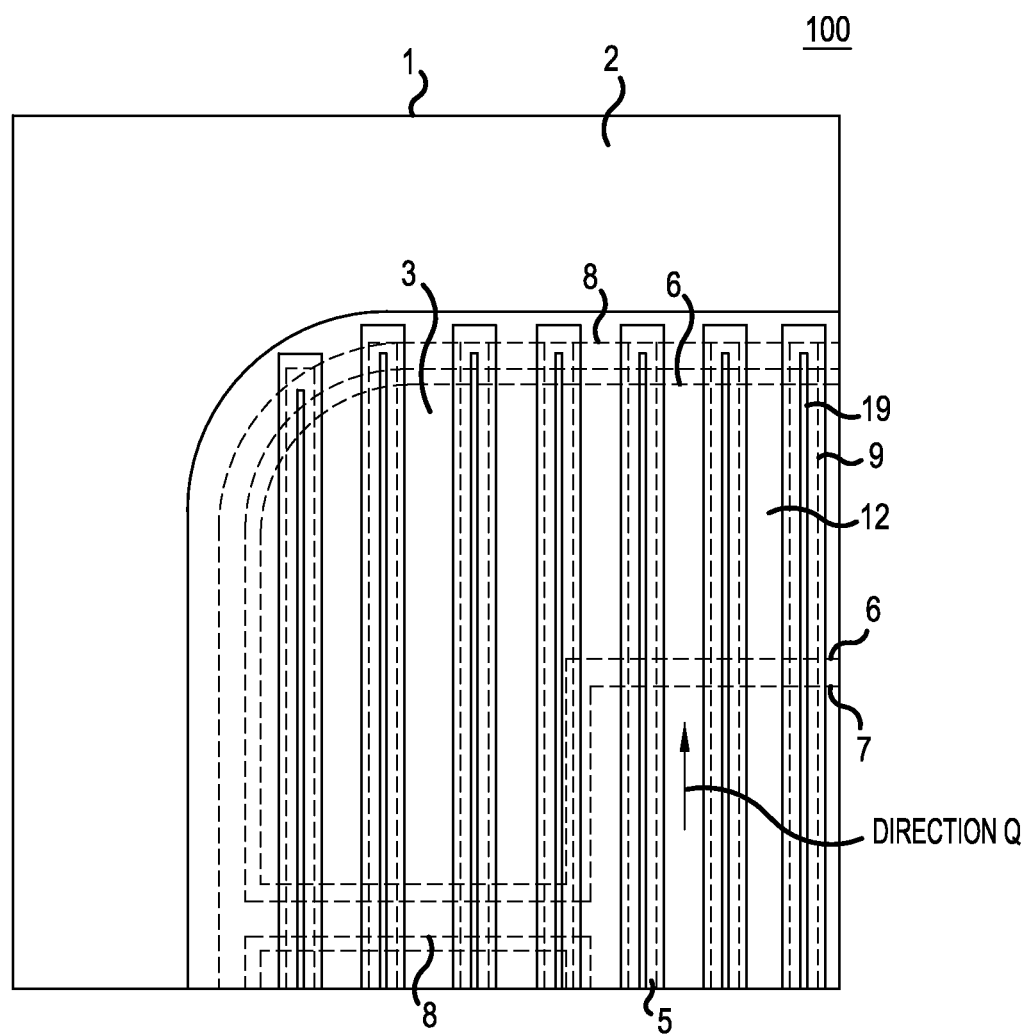
FIG. 4 is a sectional view along N-N' of FIG. 2B according to the embodiment of the invention.
Figure 5A:
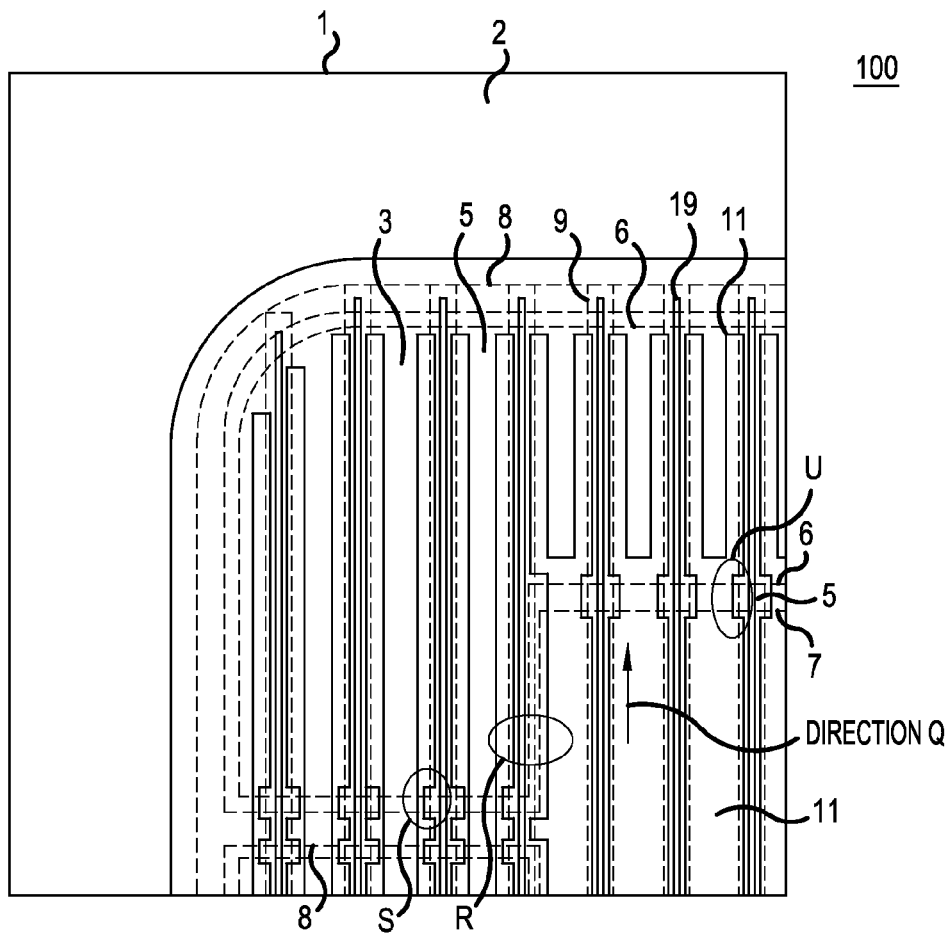
FIGS. 5A to 5D are the sectional view along N-N' of FIG. 2B according to the embodiment of the invention, a portion R enlargement, a portion S enlargement, and a portion U enlargement.

FIGS. 4 and 5A show a sectional view along N-N' of FIG. 2B. The n⁺-type source region 11 is not shown in FIG. 4, while the p⁺-type contact region 12 is not shown in FIG. 5A.

Figure 5B:
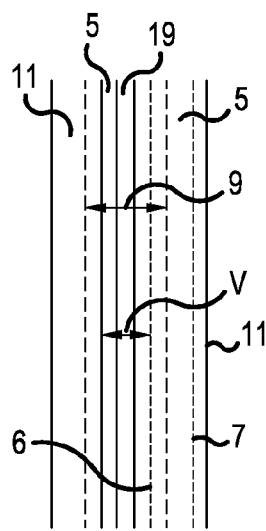
Figure 5C:
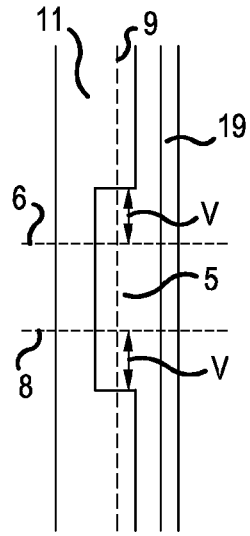
Figure 5D:
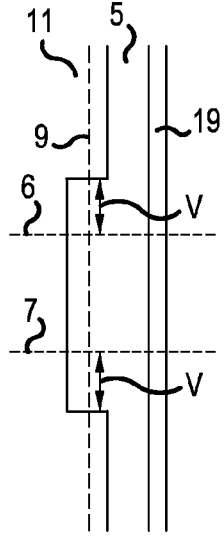

FIG. 5B shows a portion R enlargement, FIG. 5C a portion S enlargement, and FIG. 5D a portion U enlargement. Dotted lines in FIGS. 4 and 5A to 5D indicate the positions of the gate electrode 9, gate runner 8, source pad electrode 6, and gate pad electrode 7.

As shown in a portion F of FIG. 2B, the interlayer dielectric 14 is exposed in a portion above the gate electrode 9 disposed below a space between the source pad electrode 6 and gate pad electrode 7. In the same way, the interlayer dielectric 14 is also exposed in a portion above the gate electrode 9 disposed below a space between the gate runner 8 and source pad electrode 6.

As shown in the portion R enlargement of FIG. 5B, the n⁺-type source region 11 is not disposed below the gate electrode 9 disposed below the place between the source pad electrode 6 and gate pad electrode 7 in which the interlayer dielectric 14 is exposed. Because of this, a channel inversion layer 17 formed in a surface layer of the p-type well region 5 of FIG. 2B is formed in this place when the vertical semiconductor device 100 is in an on-state. However, as the inversion layer 17 is not connected to the n⁺-type source region 11, no current path via the inversion layer 17 is formed. Therefore, no fluctuation occurs in a gate threshold voltage Vth when ions or the like are introduced from the exterior into the gate insulating film 18 via the interlayer dielectric 14, even when, for example, there is an infiltration of hydrogen ions, sodium ions, chlorine ions, or the like, contained in the moisture of the peripheral atmosphere. Because of this, the vertical semiconductor device 100 can be caused to operate stably, with no fluctuation in switching characteristics or on-state characteristics.

FIG. 5C shows an enlarged view of a portion (the portion S in the drawing) below the gate electrode 9 disposed below the space between the gate runner 8 and source pad electrode 6. Ends of the gate runner 8 and source pad electrode 6 are parallel in a direction perpendicular to the direction (the direction Q in the drawing) in which the gate electrode 9 extends.

When ends of the gate runner 8 and source pad electrode 6 are parallel in a direction perpendicular to the direction (the direction Q in the drawing) in which the gate electrode 9 extends, a depressed portion is disposed in the n⁺-type source region 11 below the gate electrode 9 disposed below the space between the gate runner 8 and source pad electrode 6. Owing to a depressed portion being disposed in the n⁺-type source region 11, the n⁺-type source region 11 is not disposed below the gate electrode 9 disposed below the place between the gate runner 8 and source pad electrode 6 in which the interlayer dielectric 14 is exposed. Therefore, the channel inversion layer 17 is formed in the depressed portion of the n⁺-type source region 11 in a surface layer of the p-type well region 5 of FIG. 2B when the vertical semiconductor device 100 is in an on-state. However, in the same way as in the portion R enlargement of FIG. 5B, the channel inversion layer 17 is not connected to the n⁺-type source region 11, because of which no current path via the inversion layer 17 is formed. Because of this, no fluctuation occurs in the gate threshold voltage Vth even when ions or the like are introduced from the exterior into the gate insulating film 18 via the interlayer dielectric 14, and there is no fluctuation in the switching characteristics or on-state characteristics of the vertical semiconductor device 100. Therefore, the vertical semiconductor device 100 can be caused to operate stably.

FIG. 5D shows an enlarged view of a portion (the portion U in the drawing) below the gate electrode 9 disposed below the space between the source pad electrode 6 and gate pad electrode 7. Ends of the source pad electrode 6 and gate pad electrode 7 are parallel in a direction perpendicular to the direction (the direction Q in the drawing) in which the gate electrode 9 extends.

A depressed portion is disposed in the n⁺-type source region 11 below the gate electrode 9 disposed below the place between the source pad electrode 6 and gate pad electrode 7 in which the interlayer dielectric 14 is exposed. Owing to a depressed portion being disposed in the n⁺-type source region 11, the n⁺-type source region 11 is not disposed below the gate electrode 9 disposed below the space between the source pad electrode 6 and gate pad electrode 7. Therefore, the channel inversion layer 17 is formed in the depressed portion of the n$^+$-type source region 11 in a surface layer of the p-type well region 5 of FIG. 2B when the vertical semiconductor device 100 is in an on-state. However, in the same way as in the portion R enlargement of FIG. 5B, the channel inversion layer 17 is not connected to the n$^+$-type source region 11, because of which no current path via the inversion layer 17 is formed. Because of this, no fluctuation occurs in the gate threshold voltage Vth even when ions or the like are introduced from the exterior into the gate insulating film 18 via the interlayer dielectric 14, and there is no fluctuation in the switching characteristics or on-state characteristics of the vertical semiconductor device 100. Therefore, the vertical semiconductor device 100 can be caused to operate stably.

As shown in FIGS. 5B to 5D, the n$^+$-type source region 11 is not disposed below the gate electrode 9 disposed below the space between the source pad electrode 6 and gate pad electrode 7, or between the gate runner 8 and source pad electrode 6, in which the interlayer dielectric 14 is exposed.

As shown in FIGS. 5B to 5D, a distance V between the n$^+$-type source region 11 and source pad electrode 6, a side surface of the depressed portion of the n$^+$-type source region 11 and the source pad electrode 6, a side surface of the depressed portion of the n$^+$-type source region 11 and the gate pad electrode 7, and a side surface of the depressed portion and the gate runner 8, is 2 µm or more. When the distance V is less than 2 µm, the gate threshold voltage Vth fluctuates when ions or the like are introduced from the exterior into the gate insulating film 18 via the interlayer dielectric 14, and the switching characteristics and on-state characteristics of the vertical semiconductor device 100 fluctuate. Because of this, there is a possibility of operations of the vertical semiconductor device 100 becoming unstable. Also, the distance V is preferably 15 µm or more.

Figure 6:
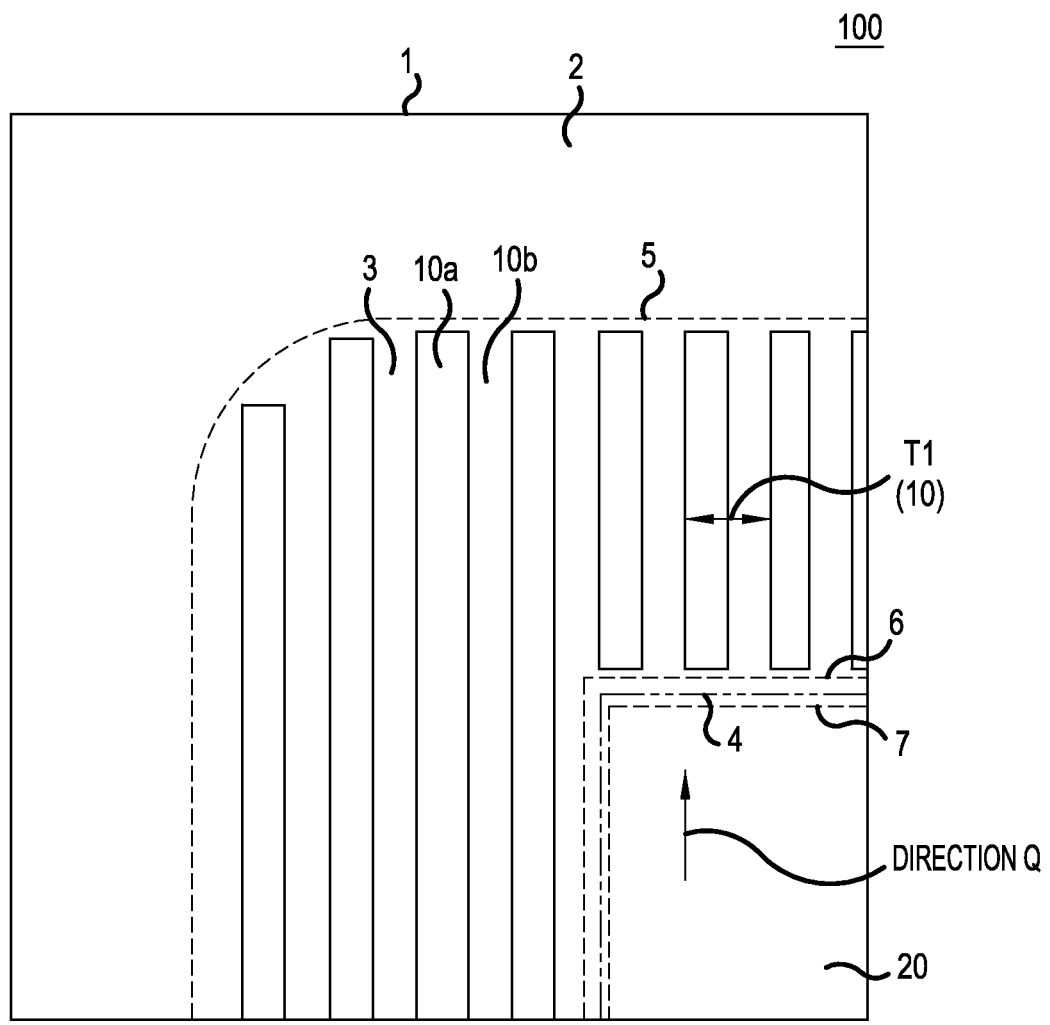
FIG. 6 is a sectional view along O-O' of FIG. 2B according to the embodiment of the invention.

FIG. 6 shows a sectional view along O-O' of FIG. 2B. As shown in FIG. 6, the n$^-$-type isolation region 20 is disposed below the gate pad electrode 7. As shown in FIG. 2B, the n$^-$-type isolation region 20 is disposed between the second parallel pn layers 13 and p-type well region 5, thereby electrically isolating the second parallel pn layers 13 and p-type well region 5.

Figure 26:
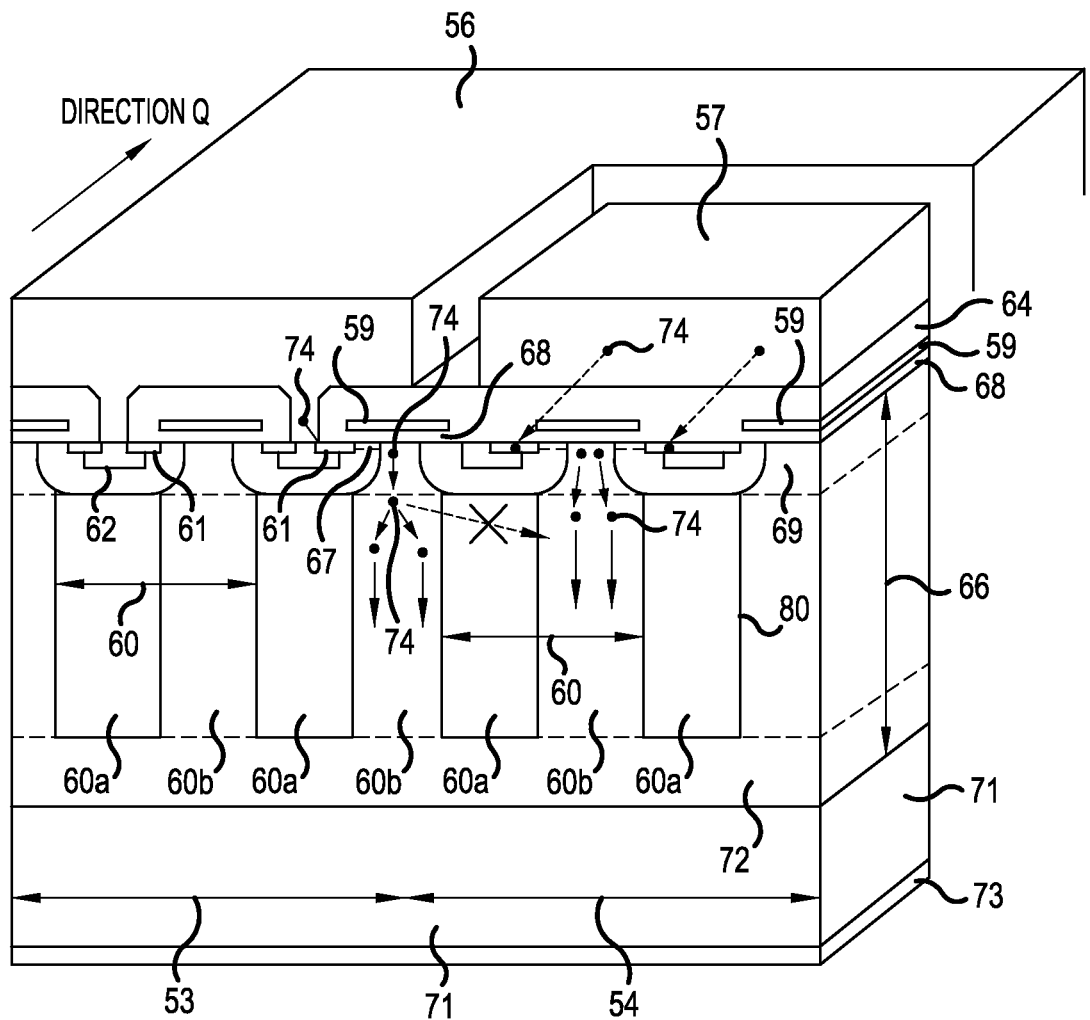
FIG. 26 is a diagram showing the flow of electrons in an on-state before entering a turn-off operation of the existing vertical semiconductor device having a superjunction structure.
Figure 27:
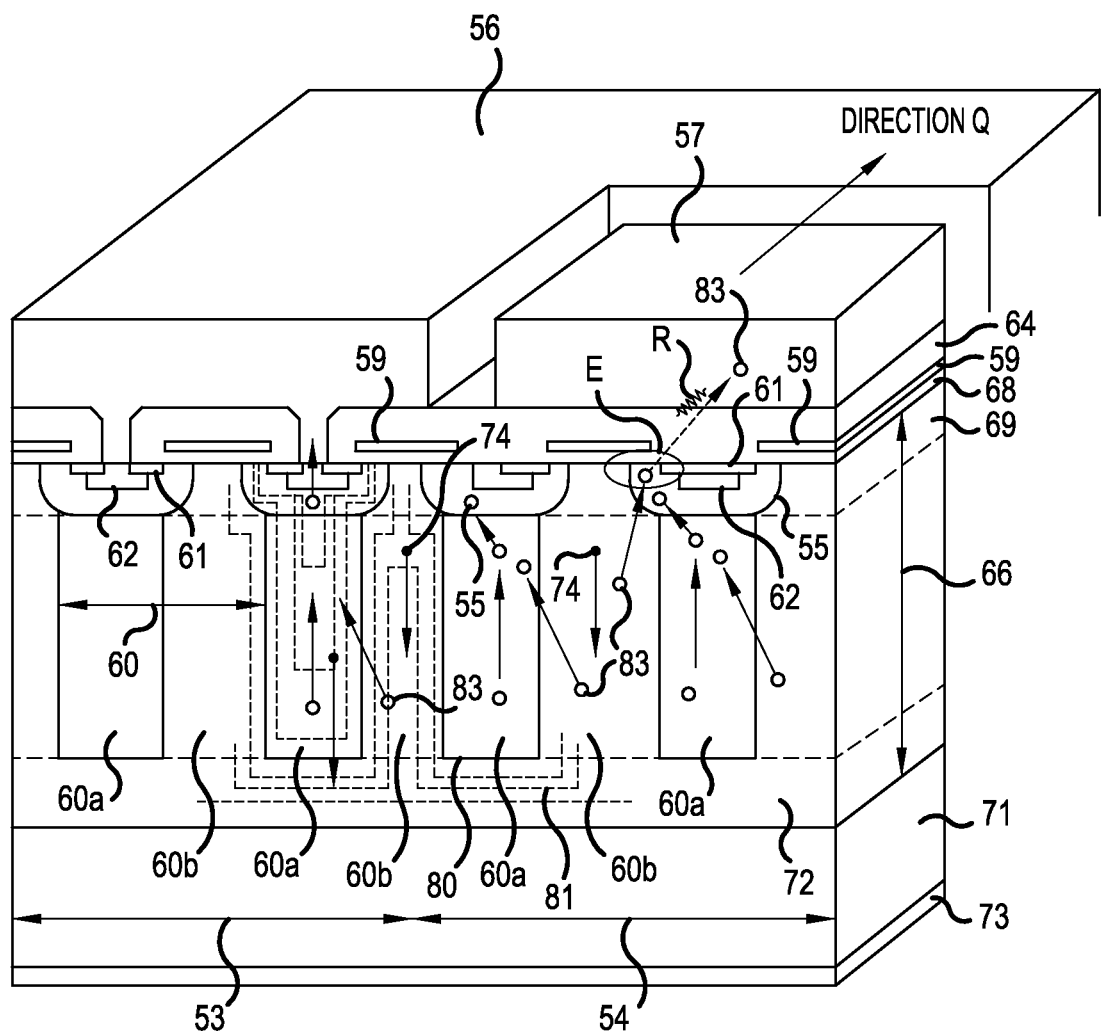
FIG. 27 is a diagram showing a state wherein a shift is made to a turn-off operation of the existing vertical semiconductor device having a superjunction structure, and the voltage rises.
Figure 28:
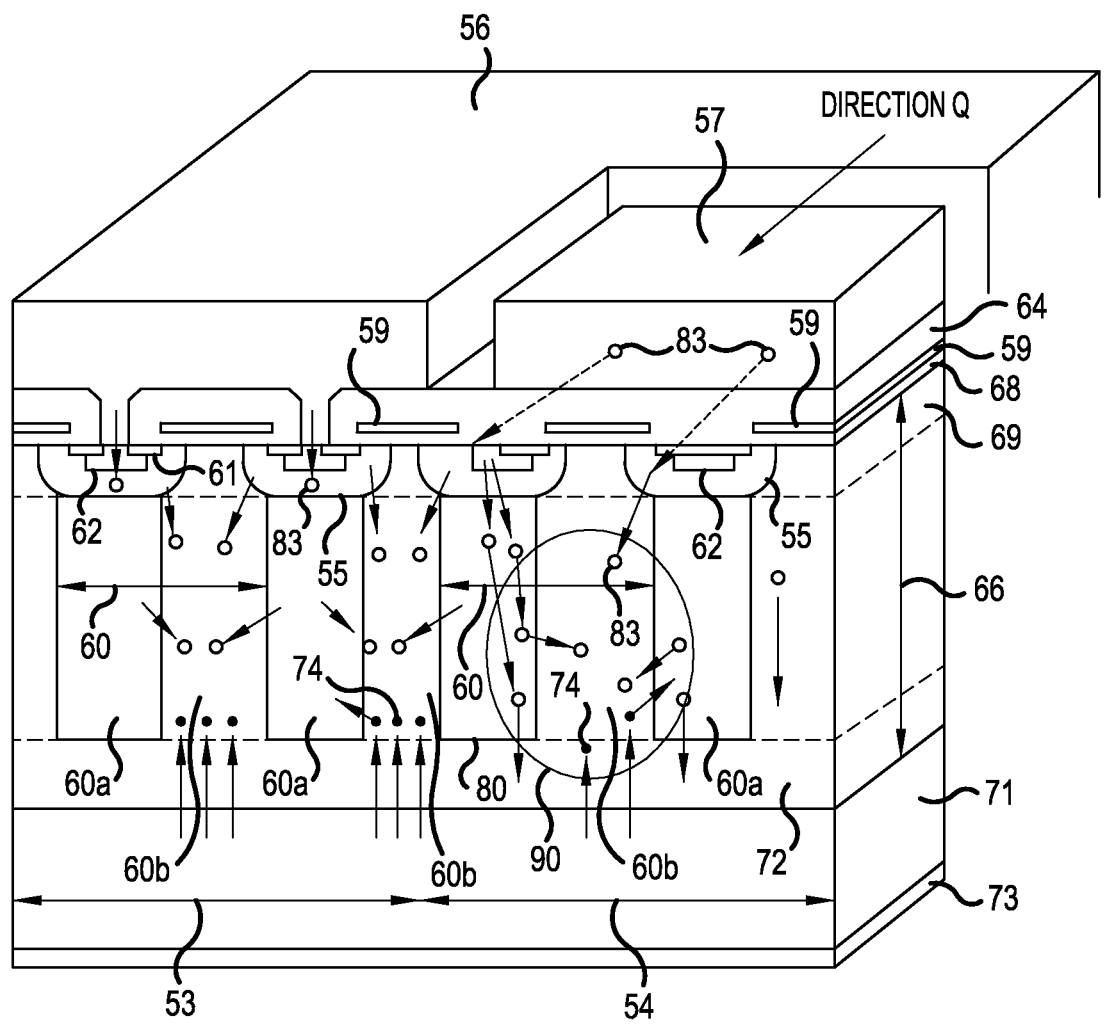
FIG. 28 is a diagram showing a state wherein forward current is flowing through a parasitic diode of the existing vertical semiconductor device having a superjunction structure.
Figure 29:
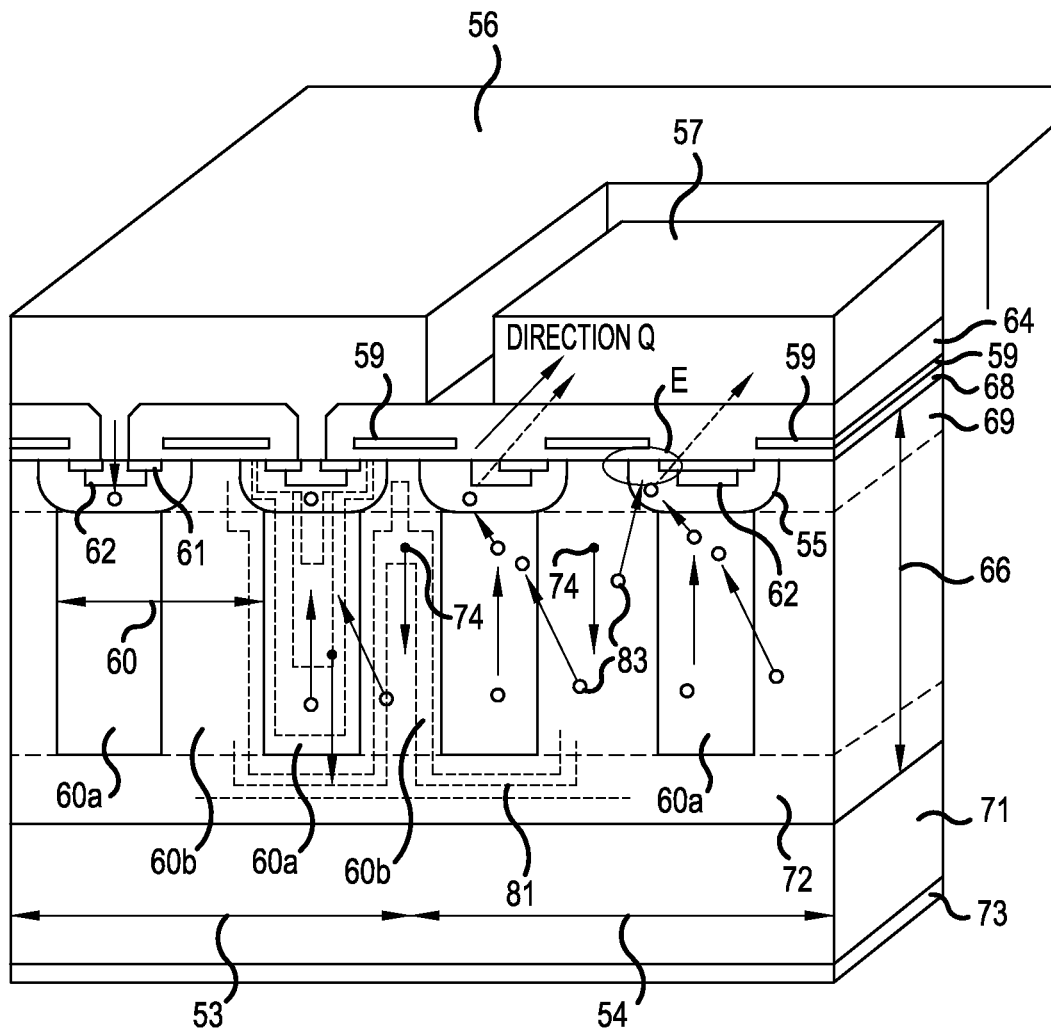
FIG. 29 is a diagram showing a state wherein reverse recovery is occurring in the parasitic diode of the existing vertical semiconductor device having a superjunction structure.

As shown in FIG. 2B, a parasitic diode is configured of a p-n junction of the p-type well region 5 and the first n$^-$-type drift region 19 and n$^-$-type isolation region 20 below the gate pad electrode 7. In the embodiments of the invention, the area of the p-n junction is smaller than that of the p-n junction 80 configured of the p-type partition region 60a and the first n$^-$-type drift region 69, second n$^-$-type drift region 72, and n-type drift region 60b shown in FIG. 26. Therefore, the reverse recovery current generated by the parasitic diode formed under the gate pad electrode 7 decreases, and reverse recovery withstand improves. Because of this, it is possible to improve the reverse recovery withstand of the vertical semiconductor device 100. Furthermore, by the n$^-$-type isolation region 20 being disposed, the electrical field concentration in the vicinity of an end portion of the gate pad electrode weakens, and it is possible to obtain high avalanche withstand and high turn-off withstand. Also, by the n$^-$-type isolation region 20 being disposed, the flow of electrons spreads, resulting in low on-state resistance.

Figure 7:
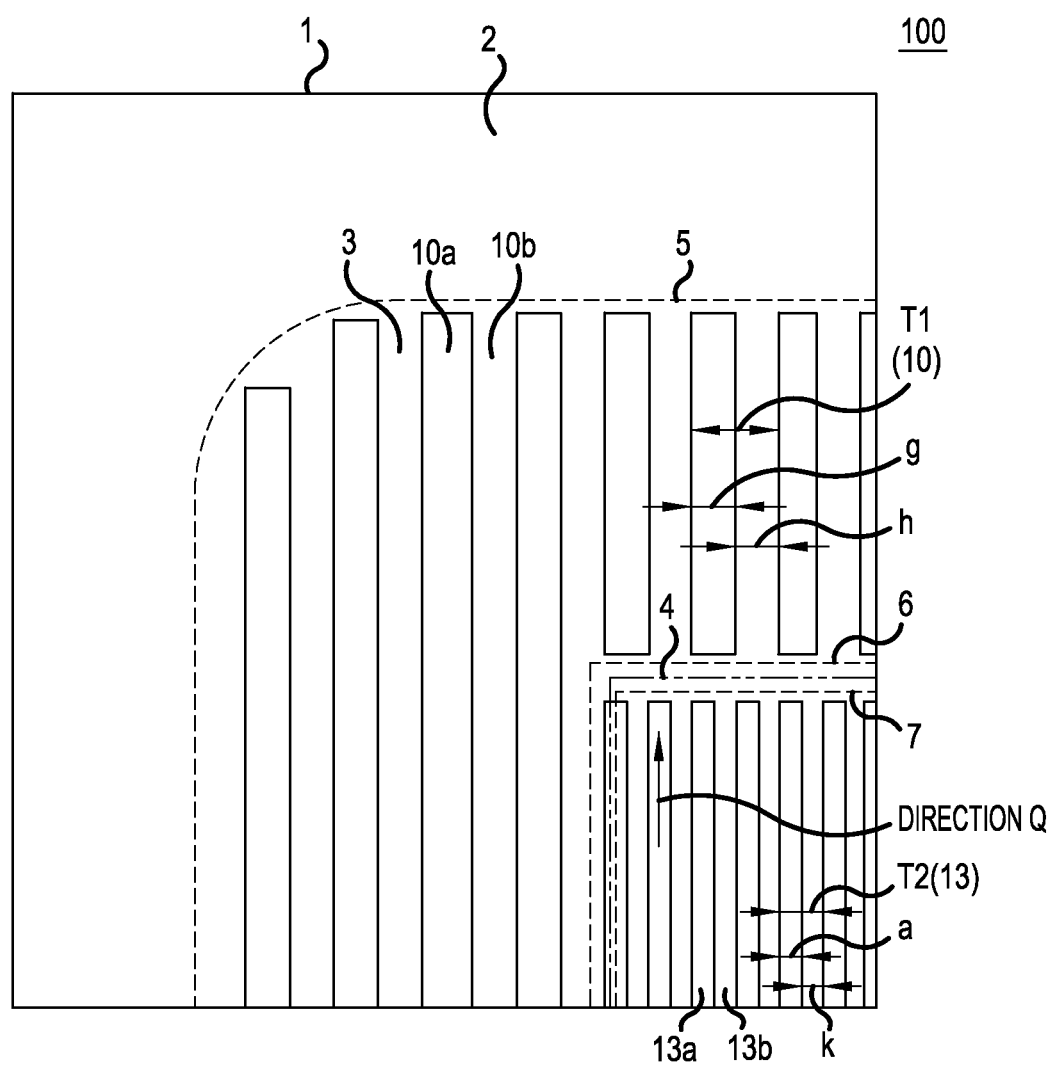
FIG. 7 is a sectional view along P-P' of FIG. 2B according to the embodiment of the invention.

FIG. 7 shows a sectional view along P-P' of FIG. 2B. As shown in FIG. 7, the first p-type partition region 10a of the first parallel pn layers 10 and the second p-type partition region 13a of the second parallel pn layers 13 are electrically isolated. Because of this, depletion layers spreading from the first p-type partition region 10a and the second p-type partition region 13a of the second parallel pn layers 13, which have differing widths, connect smoothly in isolated regions, whereby it is possible to prevent a drop in breakdown voltage.

The vertical semiconductor device 100 shown in FIG. 7 is such that the planar forms of the first parallel pn layers 10 and second parallel pn layers 13 are stripe forms. Each of the stripes extends in a direction perpendicular to the direction in which the first p-type partition region 10a and first n-type drift region 10b of the first parallel pn layers 10, and the second p-type partition region 13a and second n-type drift region 13b of the second parallel pn layers 13, are repeatedly alternately disposed. The longitudinal directions of the stripes of the planar forms of the first parallel pn layers 10 and second parallel pn layers 13 are disposed in parallel. It being acceptable that the longitudinal directions of the stripes of the planar forms of the first parallel pn layers 10 and second parallel pn layers 13 are not parallel, the longitudinal directions of the stripes of the planar forms of the first parallel pn layers 10 and second parallel pn layers 13 may be disposed so as to bisect.

Figure 8A:
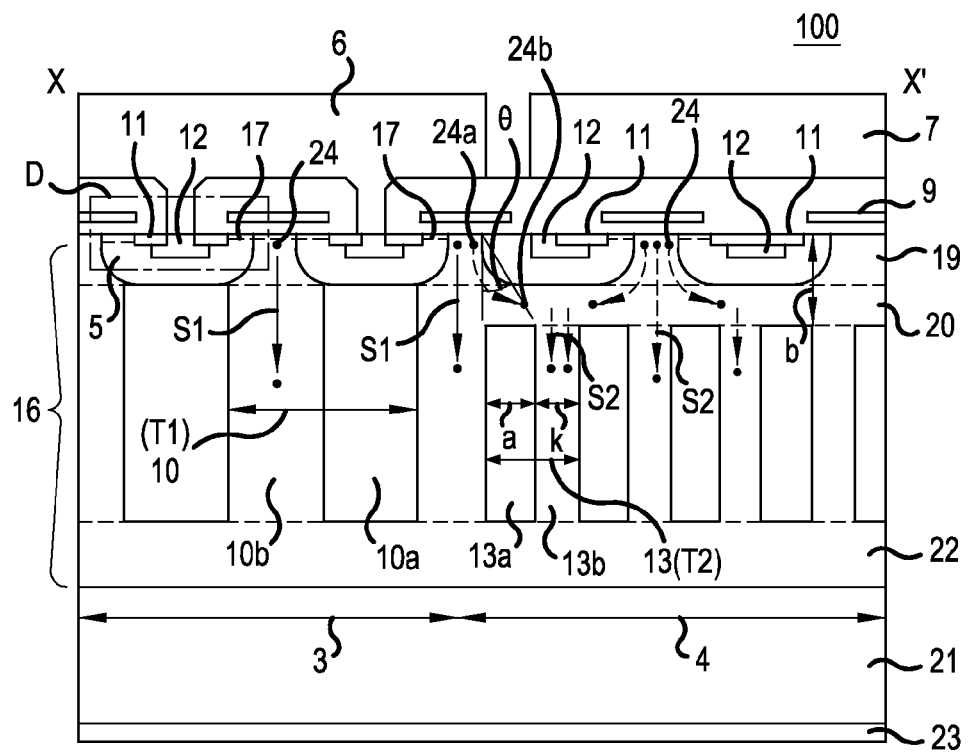
FIGS. 8A and 8B are diagrams showing a turn-off operation of a vertical semiconductor device according to the embodiment of the invention.
Figure 8B:
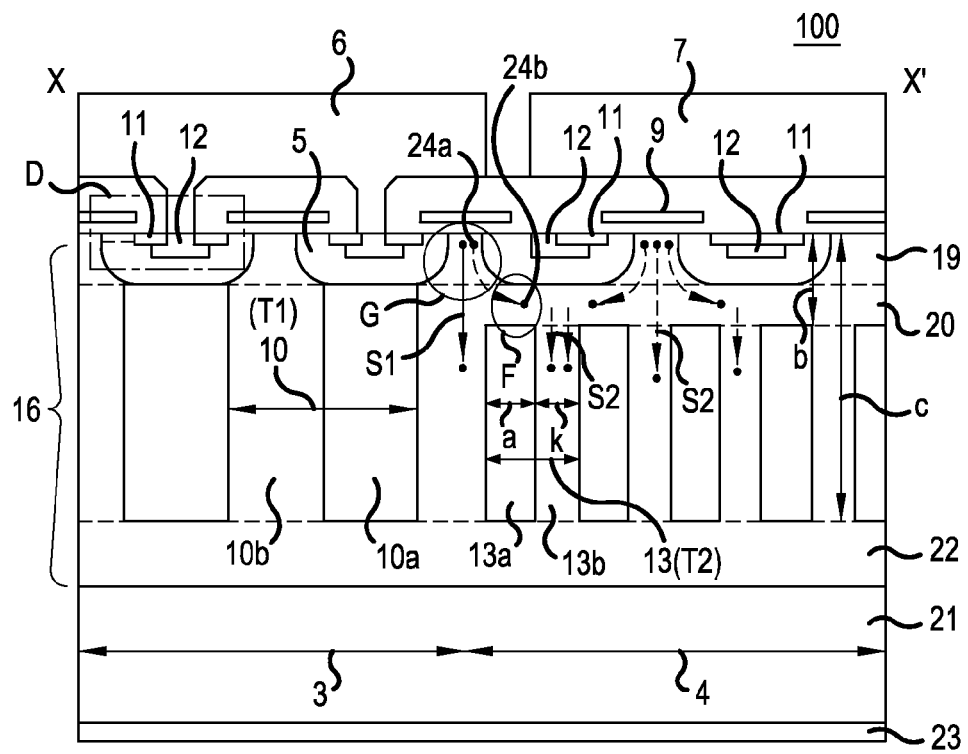

FIGS. 8A and 8B show an operation of turning off the vertical semiconductor device 100. FIG. 8A shows an aspect wherein a forward current immediately before turning off is flowing, while FIG. 8B shows a state wherein turning off is completed and the channel inversion layer is closed.

In FIG. 8A, the channel inversion layer 17 is formed in the p-type well region 5 configuring the MOS structure shown in the portion D in the drawing when the vertical semiconductor device 100 is in an on-state. At this time, the first n-type drift region 10b of the first parallel pn layers 10 becomes a main current path S1 immediately below the source pad electrode 6 disposed in the active region 3, and when the vertical semiconductor device 100 is in an on-state, the channel inversion layer 17 is also formed in the p-type well region 5 immediately below the gate pad electrode 7. Electrons 24 implanted from the p-type well region 5 into the n$^-$-type isolation region 20 flow into the second n-type drift region 13b of the second parallel pn layers 13 immediately below the gate pad electrode 7.

Figure 25A:
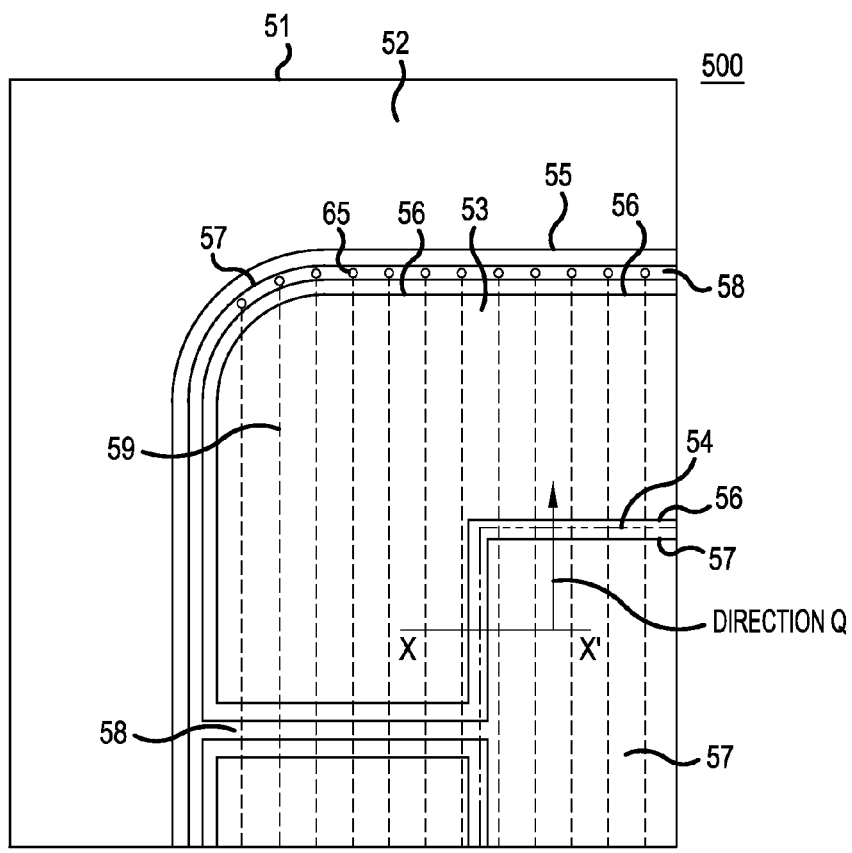
FIGS. 25A and 25B are a plan view of an existing vertical semiconductor device having a superjunction structure and a sectional view along X-X'.
Figure 25B:
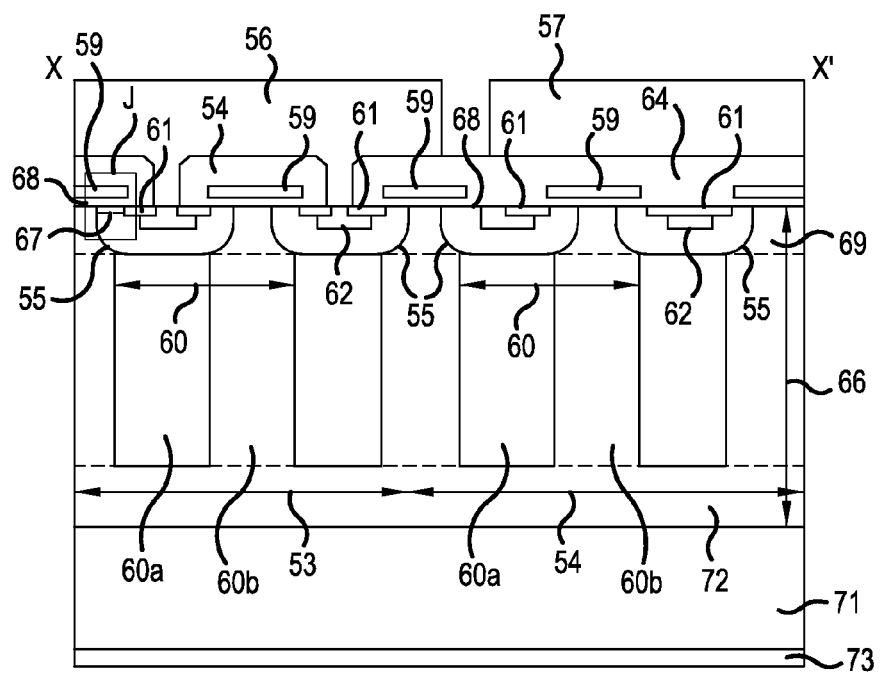

Also, the channel inversion layer 17 is formed in the p-type well region 5 between the source pad electrode 6 and gate pad electrode 7 disposed below an end portion of the source pad electrode 6, and electrons 24a implanted into the n$^-$-type isolation region 20 through the channel inversion layer 17 flow in the direction in which the second p-type partition region 13a and second n-type drift region 13b are repeatedly alternately disposed, flowing into the second n-type drift region 13b of the second parallel pn layers 13. Because of this, the current paths are wider than in the existing structure shown in FIG. 25B, wherein there is no n$^-$-type isolation region 20 under the gate pad electrode 7, so that the electrons 24a flowing out of the channel inversion layer 17 formed in the p-type well region 5 between the source pad electrode 6 and gate pad electrode 7 below an end portion of the source pad electrode 6 can flow along the current path S1 and a current path S2. Furthermore, even when the amount of electrons 24 flowing out of the channel inversion layer 17 formed in the p-type well region 5 under the gate pad electrode 7 is uneven due to variation in resistance in the direction Q of the n$^+$-type source region 11, evenness is achieved by the electrons 24 flowing in a lateral direction through the n$^-$-type isolation region 20, and flowing into the neighboring second n-type drift region 13b. The amount of electrons 24 flowing along the current path S1 formed in the active region 3 and the current path S2 formed in the gate pad region 4 depends on the impurity concentration of the n$^-$-type isolation region 20. Therefore, the higher the impurity concentration of the n⁻-type isolation region 20, the lower the resistivity of the n⁻-type isolation region 20, because of which the amount of electrons 24 flowing through the n⁻-type isolation region 20 increases, and the current flowing along the current path S2 increases.

Next, a description will be given of the relationship between the width a of the second p-type partition region 13a and the thickness b wherein the thickness of the first n⁻-type drift region 19 and the thickness of the n⁻-type isolation region 20 are combined.

When an inflow angle θ (an angle having a vertical direction with respect to the surface as a reference) of electrons 24b flowing from an upper portion of the first n⁻-type drift region 19 through the channel inversion layer 17 formed in the p-type well region 5 and spreading in the thickness direction of the vertical semiconductor device 100 exceeds 45°, it becomes drastically more difficult for the electrons 24 to spread. Because of this, the inflow angle θ of the electrons 24b is 45° or less. In order for the inflow angle θ of the electrons 24b to be 45° or less, it is good when the thickness b wherein the thickness of the first n⁻-type drift region 19 and the thickness of the n⁻-type isolation region 20 are combined is greater than the width a of the second p-type partition region 13a. By so doing, it is possible for the electrons 24 flowing into the first n⁻-type drift region 19 from the channel inversion layer 17 formed in the p-type well region 5 when the vertical semiconductor device 100 is in an on-state to effectively disperse. Therefore, the electrons 24 spread evenly in the current channel S2 under the gate pad electrode 7, and it is thus possible to reduce on-state resistance.

In FIG. 8B, the channel inversion layer 17 previously formed in the p-type well region 5 disappears in a turned-off state. An unshown depletion layer begins to spread from the p-n junction of the p-type well region 5 and n⁻-type isolation region 20 under the gate pad electrode 7 immediately after turning off. However, as the p-type well region 5 and the second p-type partition region 13a of the second parallel p-n layers 13 are isolated by the n⁻-type isolation region 20 at this time, the depletion layer has not yet started to spread in the second parallel p-n layers 13.

At the moment of turning off, the electrons 24a left in the vertical semiconductor device 100 flow along the current path S1, which flows from the first n⁻-type drift region via the first n-type drift region 10b to the n⁺-type drain region 21, and the current path S2, which flows from the first n⁻-type drift region via the n⁻-type isolation region 20 and second n-type drift region 13b to the n⁺-type drain region 21. Because of this, it is possible to prevent current from concentrating between the source pad electrode 6 and gate pad electrode 7 in the first n⁻-type drift region (a portion G) under an end portion of the source pad electrode 6.

Subsequently, the depletion layer extending from the p-type well region 5 under the gate pad electrode 7 reaches the second parallel pn layers 13, and the n⁻-type isolation region 20 (the portion F) between the p-type well region 5 and second parallel pn layers 13 attains a pinched-off state. The current paths S1 and S2 are closed by the pinching off. Therefore, the electrons 24a remaining between the source pad electrode 6 and gate pad electrode 7 under an end portion of the source pad electrode 6 are prevented from infiltrating the current path of the n⁻-type isolation region 20 under the gate pad electrode 7.

By the electrons 24a remaining between the source pad electrode 6 and gate pad electrode 7 under an end portion of the source pad electrode 6 flowing into the current paths S1 and S2 at the moment of turning off, dynamic avalanche breakdown becomes unlikely to occur, and it is possible for the vertical semiconductor device 100 to have high turn-off withstand and high reverse recovery withstand.

The vertical semiconductor device 100 of the embodiments of the invention is described as a MOSFET, but the same advantages are also obtained with an IGBT.

In the case of an IGBT, a p⁺-type region is disposed on the other main surface of the n⁺-type drain region 21, and a collector electrode is included in the p⁺-type region.

Also, the vertical semiconductor device of the embodiments of the invention is such that the second n⁻-type drift region 22 is disposed between the n⁺-type drain region 21 and the first parallel pn layers 10 and second parallel pn layers 13, but the second n⁻-type drift region 22 may not be disposed.

Second Embodiment

Figure 9:
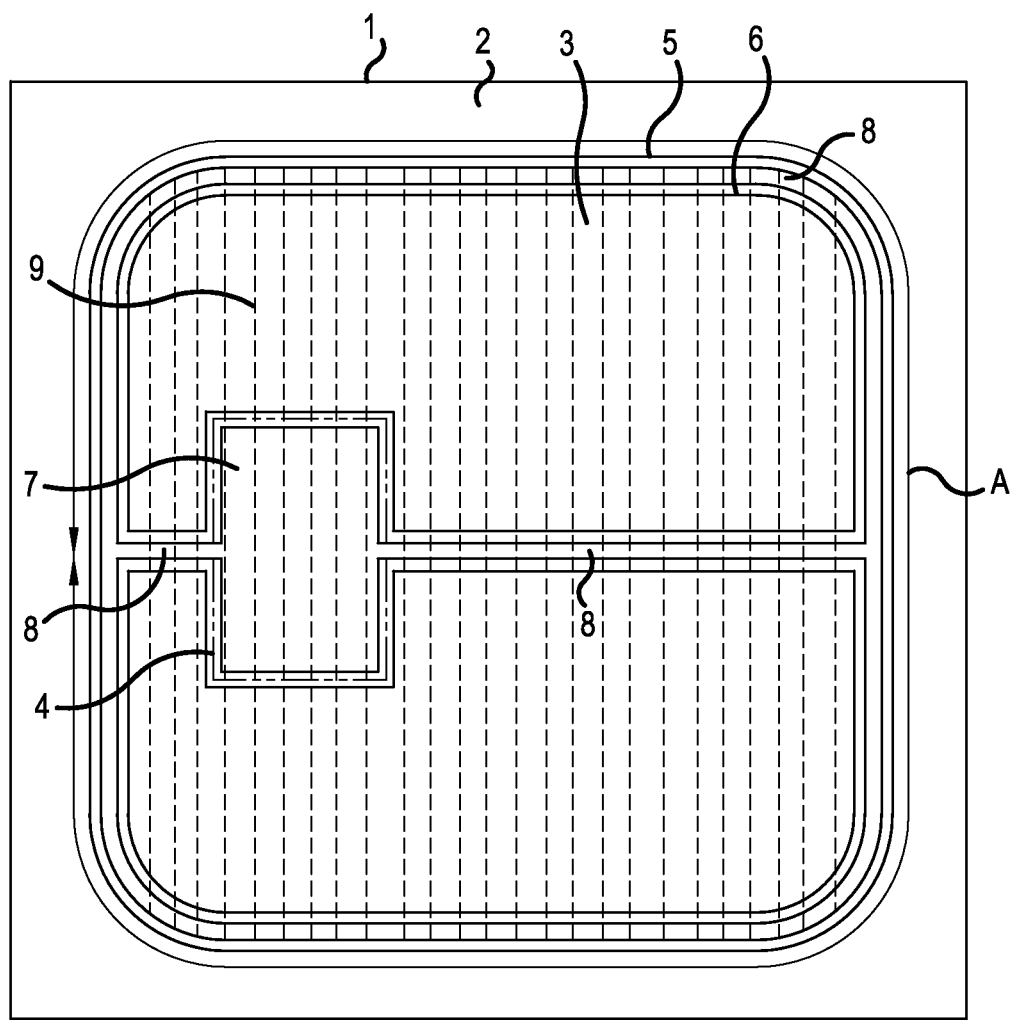
FIG. 9 is a plan view according to an embodiment of the invention.

FIG. 9 is a plan view showing a second embodiment of the invention. The gate runner 8 is disposed so as to transverse the inside of the active region 3 in a direction perpendicular to the direction in which the gate electrode 9 extends. The gate runner 8 on the outer periphery (the arrow A in the drawing) inside the active region 3 need not be formed. In this case, the gate electrode 9 is electrically connected to the gate pad electrode 7 and the gate runner 8 transversing the inside of the active region 3 via the contact hole 15, which is not shown in the drawing.

By the gate runner 8 being disposed so as to transverse the inside of the active region 3 in a direction perpendicular to the direction in which the gate electrode 9 extends, the gate wiring resistance of the gate electrode 9 is more even than in FIG. 1. Because of this, the turn-on/turn-off time lag between the central portion and end portion of the active region 3 of the vertical semiconductor device 100 is eliminated, and erroneous turning on and off is suppressed.

Third Embodiment

Figure 10:
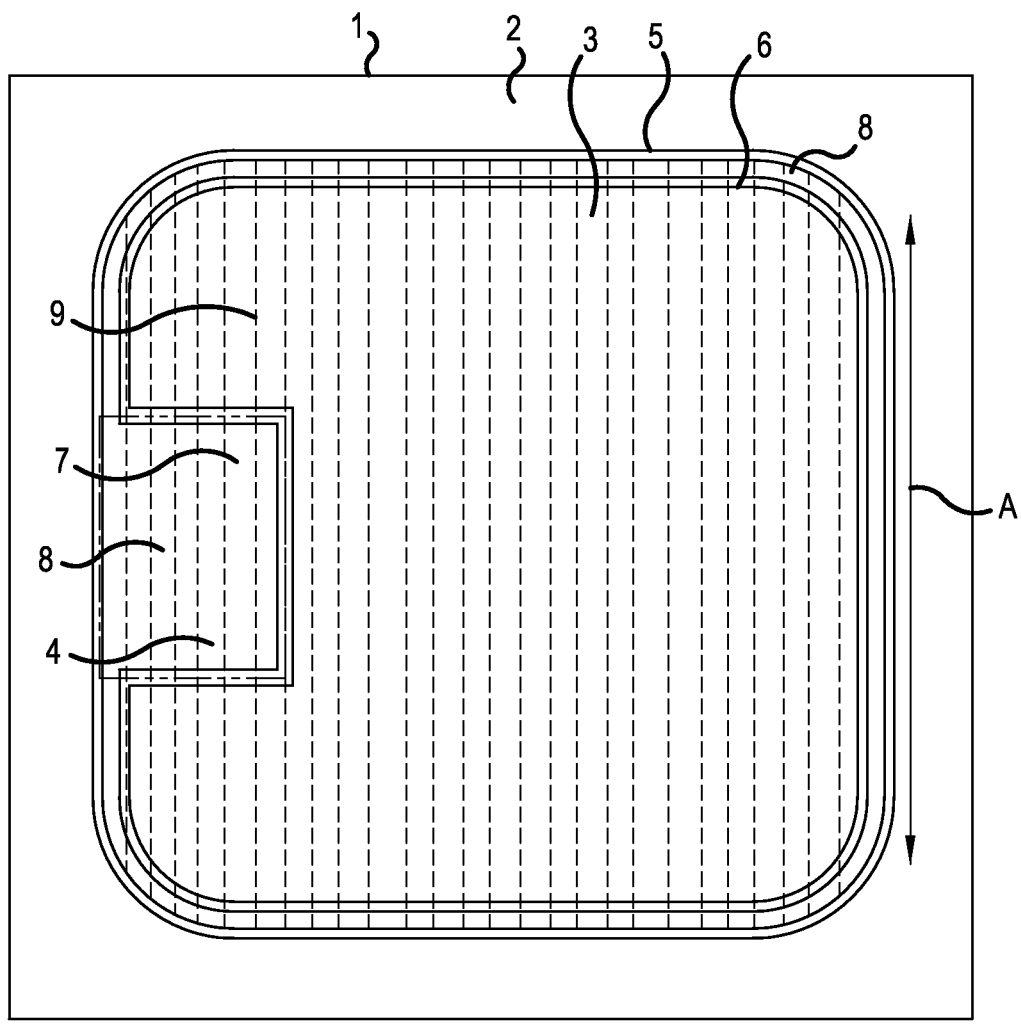
FIG. 10 is a plan view according to an embodiment of the invention.

FIG. 10 is a plan view showing a third embodiment of the invention. One side of the gate pad electrode 7 is disposed in the vicinity of an end portion inside the active region 3. The gate runner 8 is disposed on the outer periphery inside the active region 3. One side (the arrow A in the drawing) of the gate runner 8 disposed parallel to the direction in which the gate electrode 9 extends may not be formed.

By one side of the gate pad electrode 7 being disposed in the vicinity of an end portion inside the active region 3 and the gate runner 8 being disposed on the outer periphery inside the active region 3, it is possible to dispose the MOS structure portion utilizing the effective area of the active region 3 to a greater extent than in FIGS. 1 and 9. Because of this, it is possible to reduce on-state resistance, and thus reduce conduction loss.

Fourth Embodiment

Figure 11:
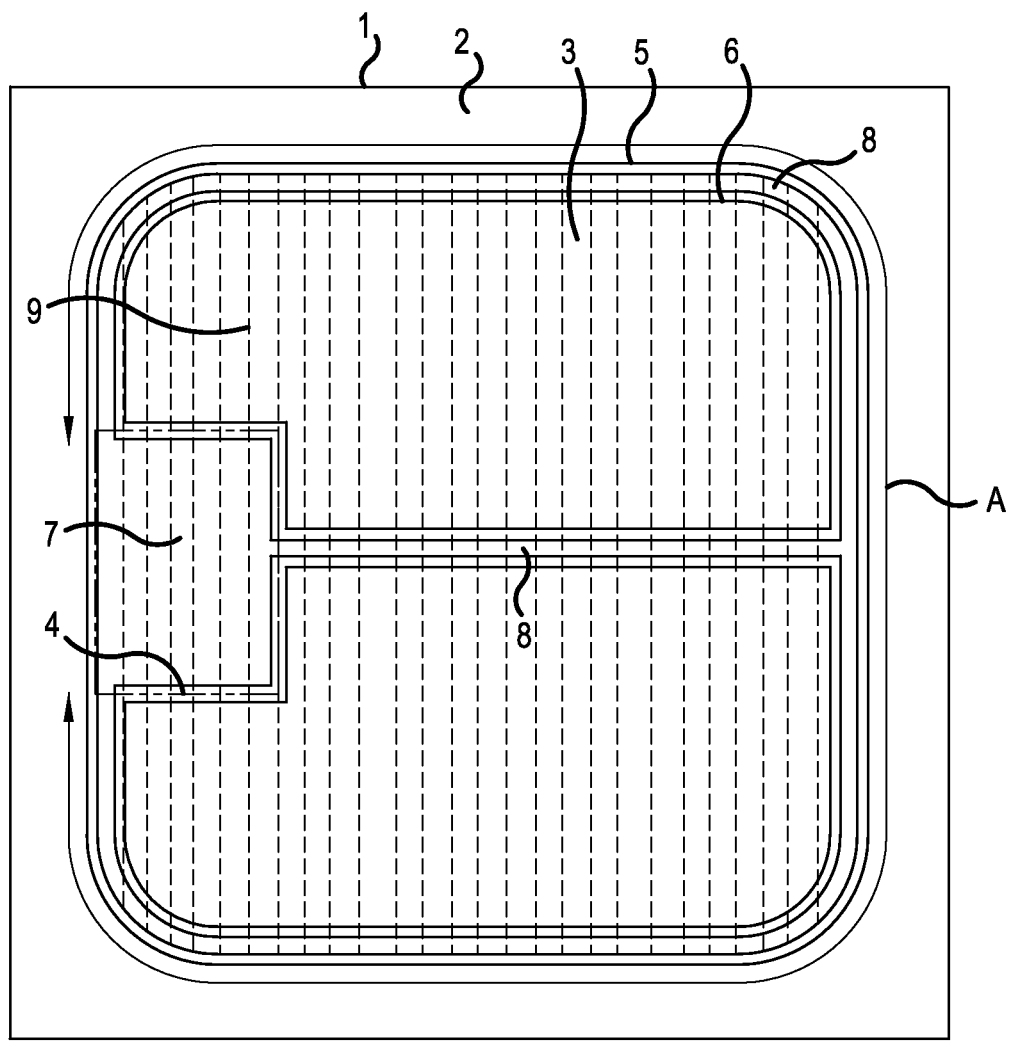
FIG. 11 is a plan view according to an embodiment of the invention.

FIG. 11 is a plan view showing a fourth embodiment of the invention. One side of the gate pad electrode 7 is disposed in the vicinity of an end portion inside the active region 3. The gate runner 8 is disposed so as to transverse the inside of the active region 3 in a direction perpendicular to the direction in which the gate electrode 9 extends, and is also disposed on the outer periphery inside the active region 3. The gate runner 8 on the outer periphery (the arrow A in the drawing) inside the active region 3 may not be formed. In this case, the gate electrode 9 is electrically connected to the gate pad electrode 7 and the gate runner 8 transversing the inside of the active region 3 via the contact hole 15, which is not shown in the drawing.

Fifth Embodiment

Figure 12:
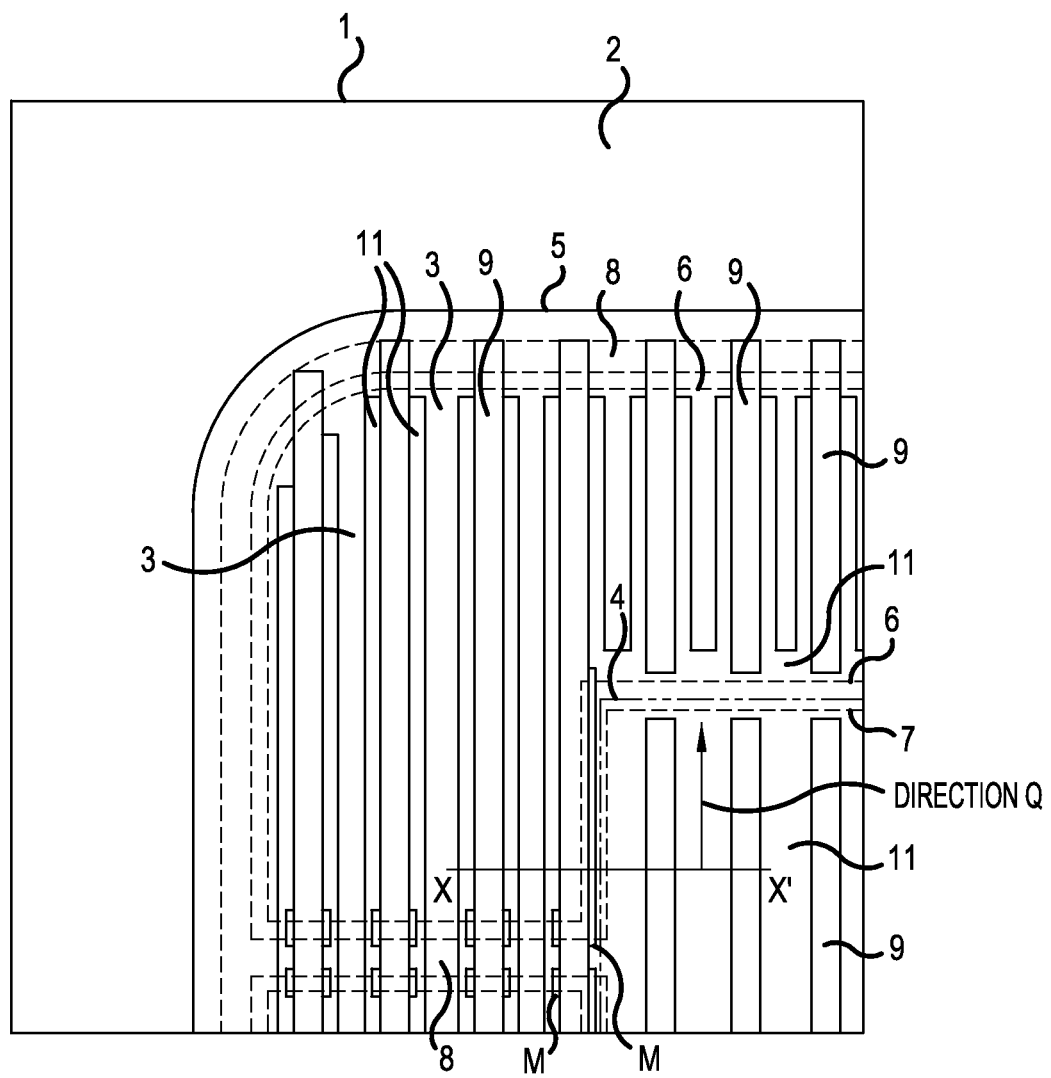
FIG. 12 is an enlargement of the portion B of FIG. 1 according to an embodiment of the invention.

FIG. 12 is an enlargement of the portion B of FIG. 1 showing a fifth embodiment of the invention. Further, FIG. 12 is a plan view showing the positions of the gate electrode 9 and $n^+$-type source region 11. Dotted lines in the drawing indicate the positions of the source pad electrode 6, gate pad electrode 7, and gate runner 8. The planar form of the gate electrode 9 below the source pad electrode 6 is a stripe form, and differs from FIGS. 3 and 4 in being isolated from the gate electrode 9 under the gate pad electrode 7. The gate electrode 9 is electrically connected to the gate pad electrode 7 via the gate runner 8 disposed on the outer periphery inside the active region 3. Meanwhile, the gate electrode 9 inside the gate pad region 4 is directly electrically connected to the gate pad electrode 7 via the contact hole 15, which is not shown in the drawing. The gate electrode 9 is not formed below a space between the source pad electrode 6 and gate pad electrode 7. Because of this, as in the first embodiment, no fluctuation occurs in the MOSFET gate threshold voltage Vth when ions or the like are introduced from the exterior of the interlayer dielectric 14, even when, for example, there is an infiltration of ions such as hydrogen ions, sodium ions, or chlorine ions contained in the moisture of the external peripheral atmosphere, and there is thus no effect on the operations of the MOSFET.

Sixth Embodiment

Figure 13:
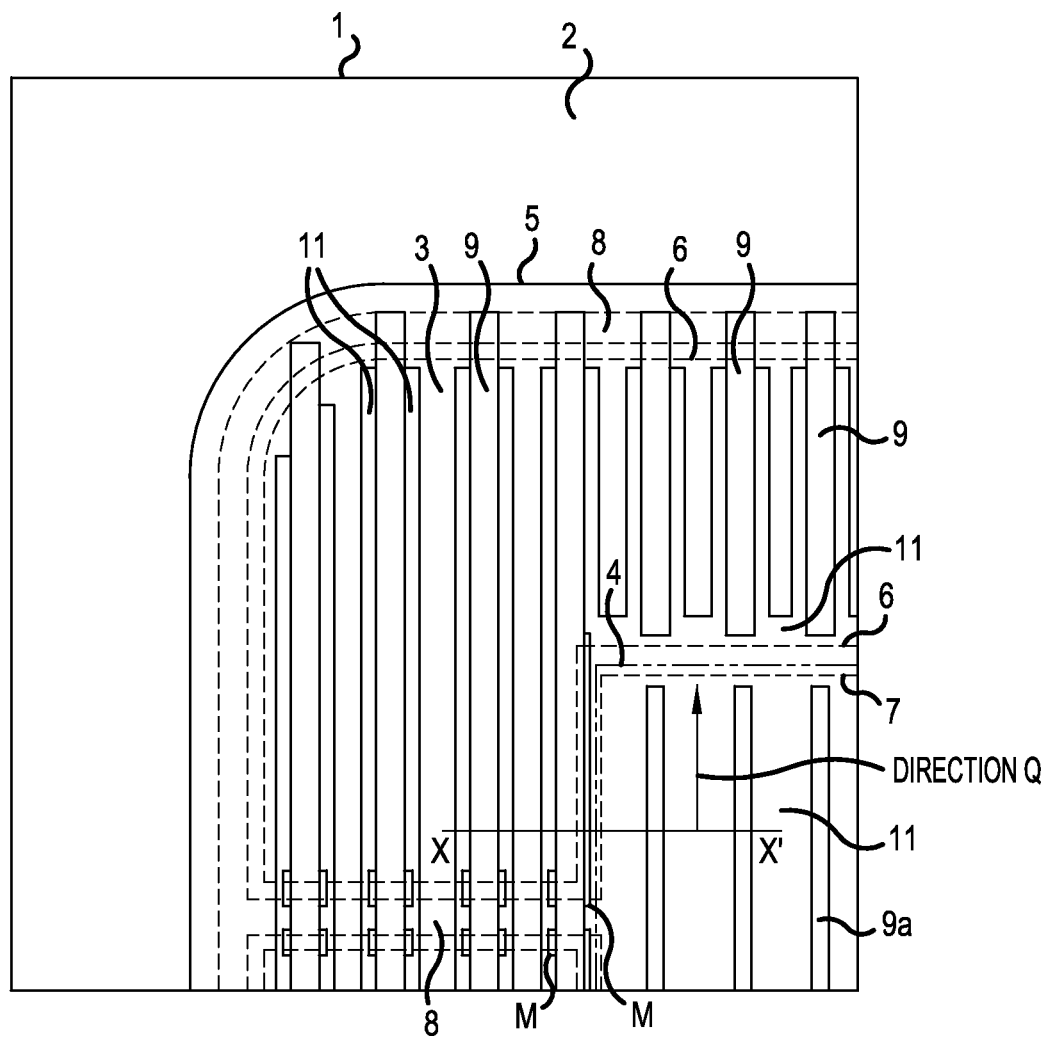
FIG. 13 is an enlargement of the portion B of FIG. 1 according to an embodiment of the invention.

FIG. 13 is an enlargement of the portion B of FIG. 1 showing a sixth embodiment of the invention. FIG. 13 is a plan view showing the gate electrode 9 and $n^+$-type source region 11. FIG. 13 differs from FIG. 12 in that a gate electrode 9a under the gate pad electrode 7 is formed to be narrower than the gate electrode 9 formed inside the active region 3. Because of this, it is possible to reduce a gate charge Qg accumulated in a gate capacitor, thus reducing switching loss.

Seventh Embodiment

Figure 14:
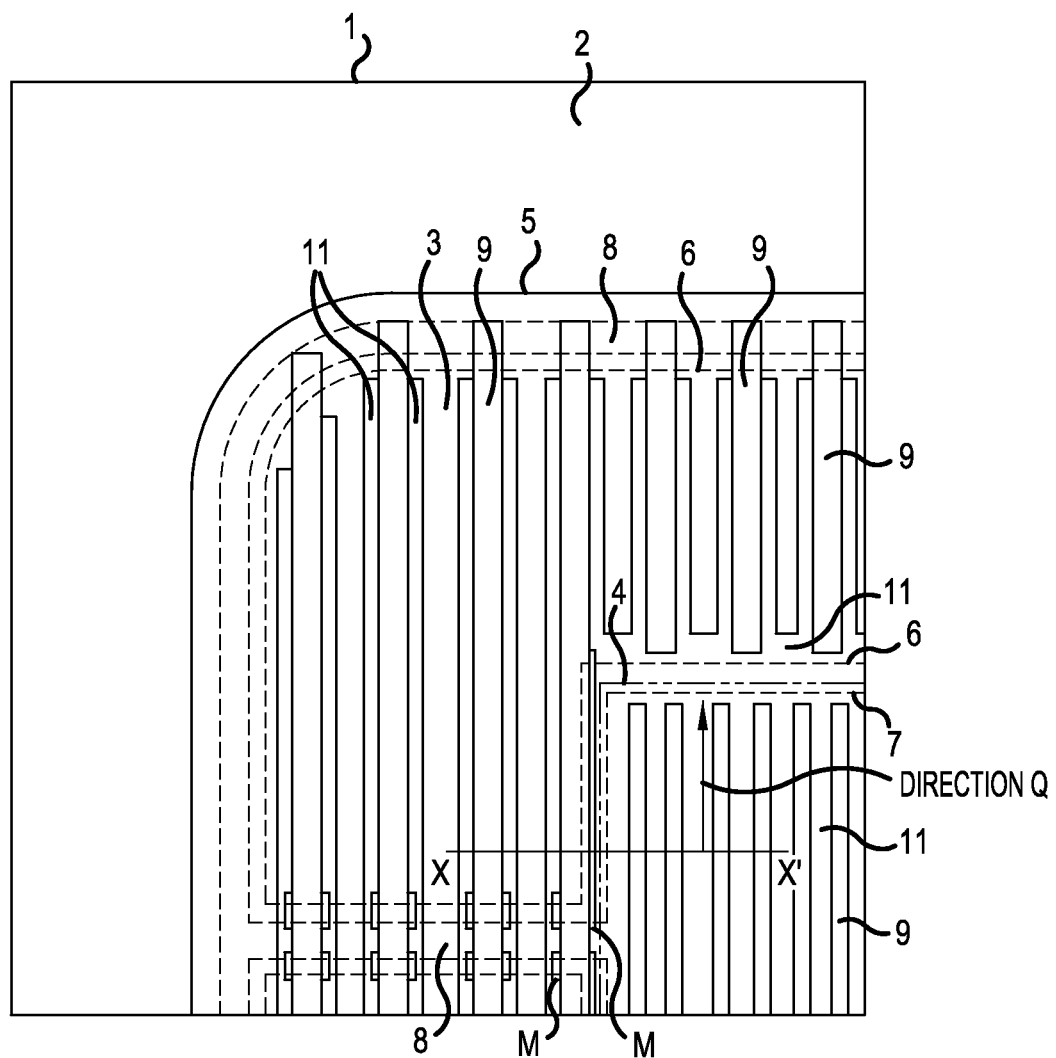
FIG. 14 is an enlargement of the portion B of FIG. 1 according to an embodiment of the invention.

FIG. 14 is an enlargement of the portion B of FIG. 1 showing a seventh embodiment of the invention. FIG. 14 is a plan view showing the positions of the gate electrode 9 and $n^+$-type source region 11. The planar form of the gate electrode 9 is a stripe form. FIG. 14 differs from FIG. 13 in that the pitch in the lateral direction of the stripes of the planar form of the gate electrode 9 of the gate pad region 4 is shorter. Because of this, it is possible to increase the density of the channel inversion layer 17 formed in the p-type well region 5 under the gate pad electrode 7. Because of this, it is possible to reduce on-state resistance, and thus reduce conduction loss.

Eighth Embodiment

Figure 15:
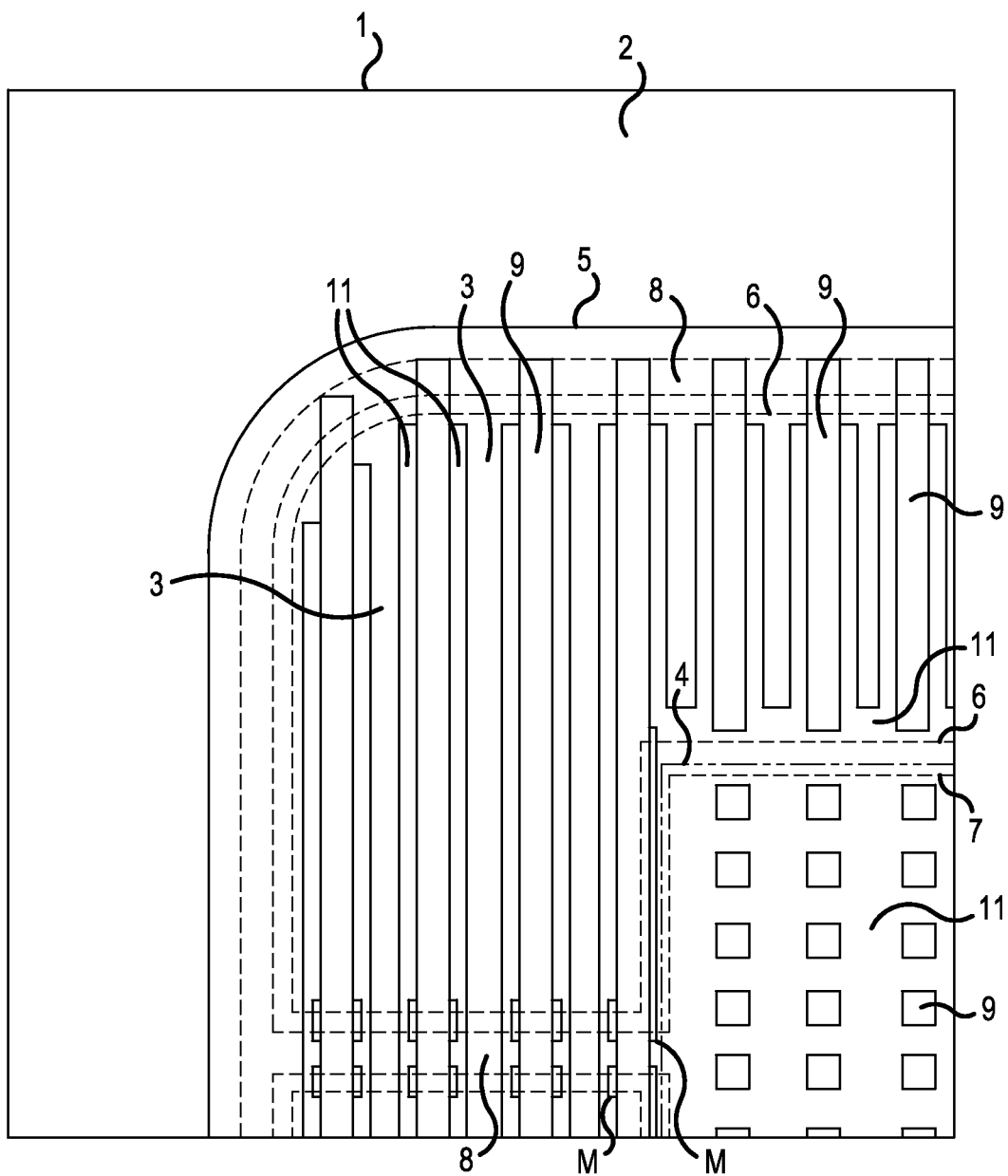
FIG. 15 is an enlargement of the portion B of FIG. 1 according to an embodiment of the invention.

FIG. 15 is an enlargement of the portion B of FIG. 1 showing an eighth embodiment of the invention. FIG. 15 is a plan view showing the positions of the gate electrode 9 and $n^+$-type source region 11. FIG. 15 differs from FIG. 12 in that the planar form of the gate electrode 9 under the gate pad electrode 7 is a lattice form. Because of this, it is possible to obtain the same advantages as in the fifth embodiment.

Ninth Embodiment

Figure 16:
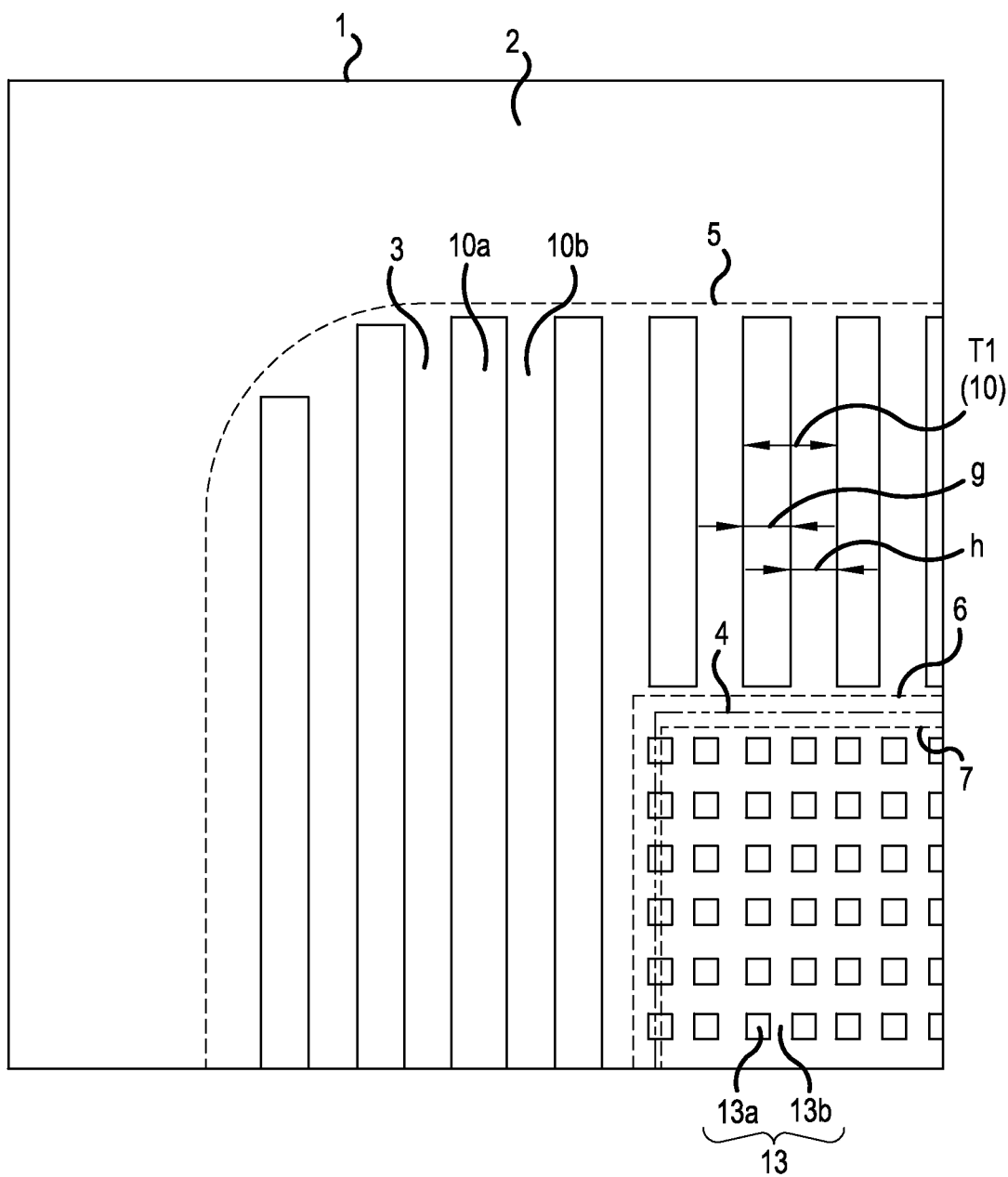
FIG. 16 is a sectional view along P-P' of FIG. 2B according to an embodiment of the invention.

FIG. 16 is a sectional view along P-P' of FIG. 2B showing a ninth embodiment of the invention, and is a plan view corresponding to FIG. 7. FIG. 16 differs from FIG. 7 in that the second p-type partition region 13a configuring the second parallel pn layers 13 is disposed in a lattice form. Because of this, the spread of the depletion layer is more even than when the planar form of the second p-type partition region 13a is a stripe form, and it is easier to ensure breakdown voltage.

Tenth Embodiment

Figure 17:
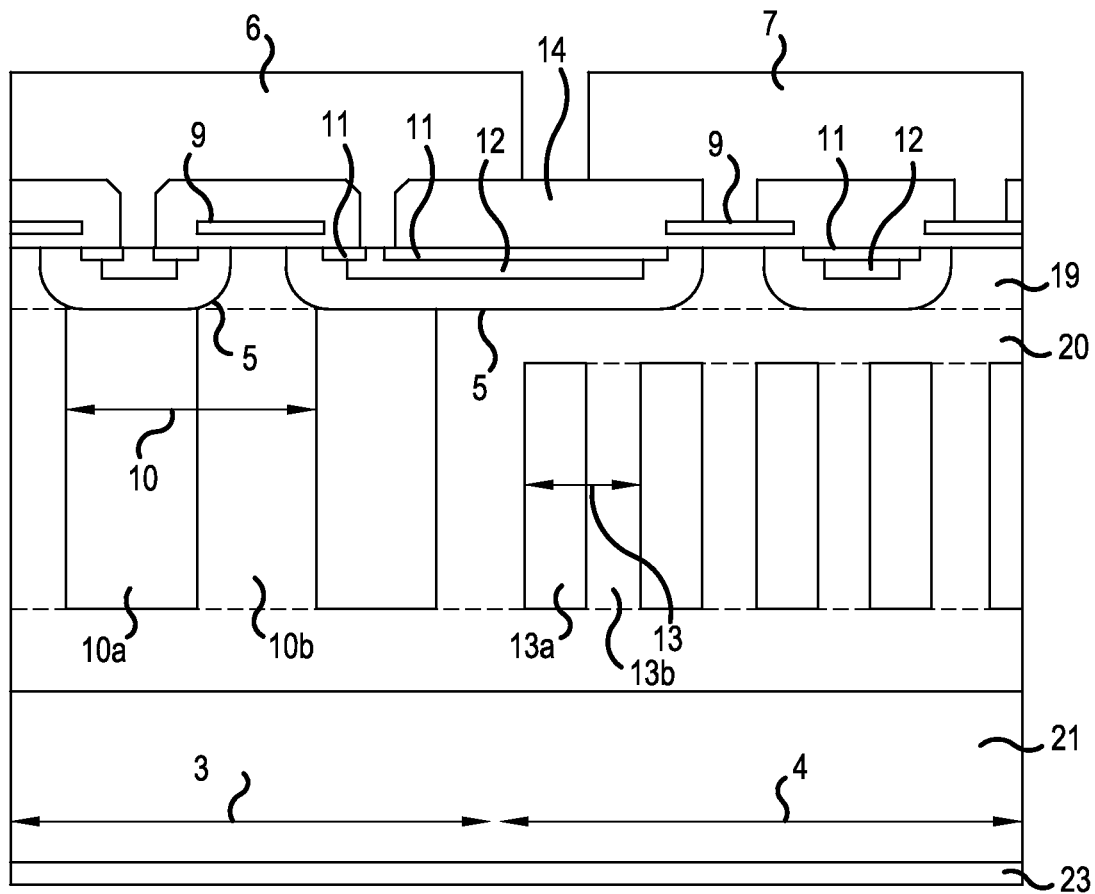
FIG. 17 is a sectional view along X-X' of FIGS. 12 to 14 according to an embodiment of the invention.

FIG. 17 is a sectional view along X-X' of FIGS. 12 to 14 showing a tenth embodiment of the invention. The p-type well region 5 disposed below the space between the source pad electrode 6 and gate pad electrode 7 is formed straddling a portion below the source pad electrode 6 and a portion below the gate pad electrode 7, and the $n^+$-type source region 11 disposed below the outer periphery of the gate pad electrode 7 is connected to the source pad electrode 6. The gate electrode 9 below the gate pad electrode 7 is isolated from the gate electrode 9 below the source pad electrode 6. The gate electrode 9 below the source pad electrode 6 is connected to the gate pad electrode 7 via the gate runner 8.

Also, the gate electrode 9 is not formed below the place between the source pad electrode 6 and gate pad electrode 7 in which the interlayer dielectric 14 is exposed. The gate electrode 9 below the gate pad electrode 7 electrically connects the gate pad electrode 7 in one portion inside the gate pad region 4, as shown in FIG. 17. The $n^+$-type source region 11 below the gate pad electrode 7 is connected to the source pad electrode 6 opposing the gate pad electrode 7. Because of this, the channel inversion layer 17 is formed in the p-type well region 5 formed straddling a portion below the source pad electrode 6 and a portion below the gate pad electrode 7. However, the $n^+$-type source region 11 being formed below the place between the source pad electrode 6 and gate pad electrode 7 in which the interlayer dielectric 14 is exposed, the channel inversion layer 17 is not formed. Therefore, no fluctuation occurs in the gate threshold voltage when ions or the like are introduced from the exterior into the gate insulating film 18 via the interlayer dielectric 14, even when, for example, hydrogen ions, sodium ions, chlorine ions, or the like, contained in the moisture of the external peripheral atmosphere are introduced. Because of this, the vertical semiconductor device 100 can be caused to operate stably, with no fluctuation in the switching characteristics or on-state characteristics of the vertical semiconductor device 100.

Eleventh Embodiment

FIGS. 18A to 20G are sectional views of manufacturing steps showing an eleventh embodiment of the invention.

Figure 18A:
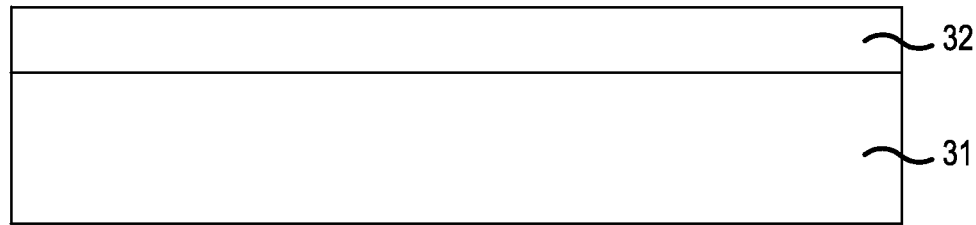
FIGS. 18A to 18C are sectional views showing manufacturing steps according to an embodiment of the invention.

As shown in FIG. 18A, an $n^-$-type epitaxial layer 32 is formed on a main surface of an $n^+$-type substrate 31 with a thickness of, for example, 200 μm. The $n^+$-type substrate 31 becomes the $n^+$-type drain region 21.

Figure 18B:
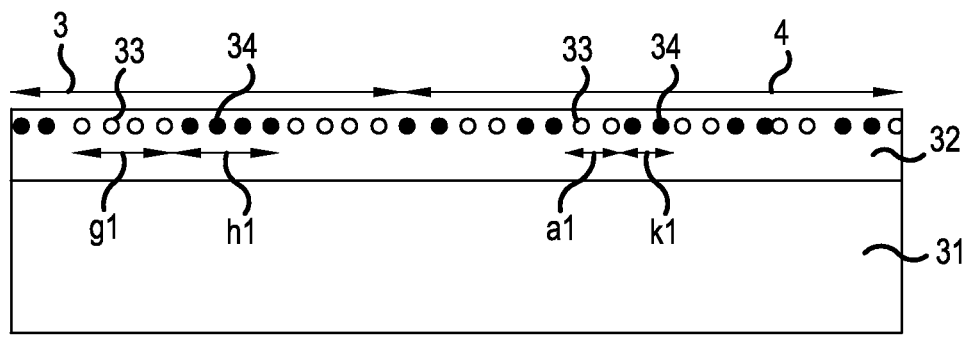

As shown in FIG. 18B, boron 33, which is an n-type impurity, and phosphorus 34, which is a p-type impurity, are selectively ion implanted, with an unshown resist mask as a mask, into the $n^-$-type epitaxial layer 32 formed on the $n^+$-type substrate 31. At this time, the apertures of the resist mask are formed so that widths a1 and k1 (which become the width a of the second p-type partition region 13a and the width k of the second n-type drift region 13b after thermal diffusion) of implantation regions of the boron 33 and phosphorus 34 driven into a region that becomes the gate pad region 4 are smaller than widths g1 and h1 (which become the width g of the first p-type partition region 10a and the width h of the first n-type drift region 10b after thermal diffusion) of implantation regions of the boron 33 and phosphorus 34 driven into a region that becomes the active region 3.

Figure 18C:
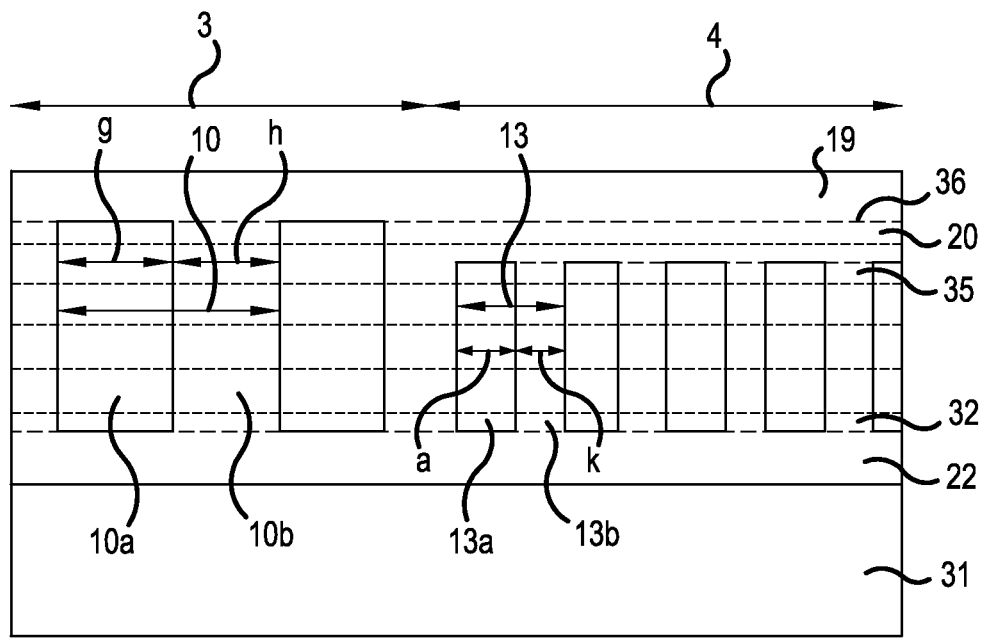

Furthermore, as shown in FIG. 18C, the formation of the n⁻-type epitaxial layer 32 and the selective ion implantation are repeated multiple times (repeated five times here). After forming an n⁻-type epitaxial layer 35 one before an uppermost layer, the boron 33 and phosphorus 34 are ion implanted into only the place that becomes the active region 3. Continuing, an uppermost n⁻-type epitaxial layer 36 is formed. Subsequently, thermal diffusion is carried out by performing a thermal processing, thereby forming the first p-type partition region 10a, second p-type partition region 13a, first n-type drift region 10b, and second n-type drift region 13b. The first parallel pn layers 10 are formed of the first p-type partition region 10a and first n-type drift region 10b, while the second parallel pn layers 13 are formed of the second p-type partition region 13a and second n-type drift region 13b. The place in the n⁻-type epitaxial layer 35, wherein ion implantation is carried out into only the place that becomes the active region 3, in which the second p-type partition region 13a and second n-type drift region 13b are not formed becomes the n⁻-type isolation region 20. Also, the uppermost n⁻-type epitaxial layer 36 becomes the first n⁻-type drift region 19. Furthermore, the region of the n⁻-type epitaxial layer 32 formed on the upper surface of the n⁺-type substrate 31 in which the first p-type partition region 10a, second p-type partition region 13a, first n-type drift region 10b, and second n-type drift region 13b are not formed becomes the second n⁻-type drift region.

Figure 19A:
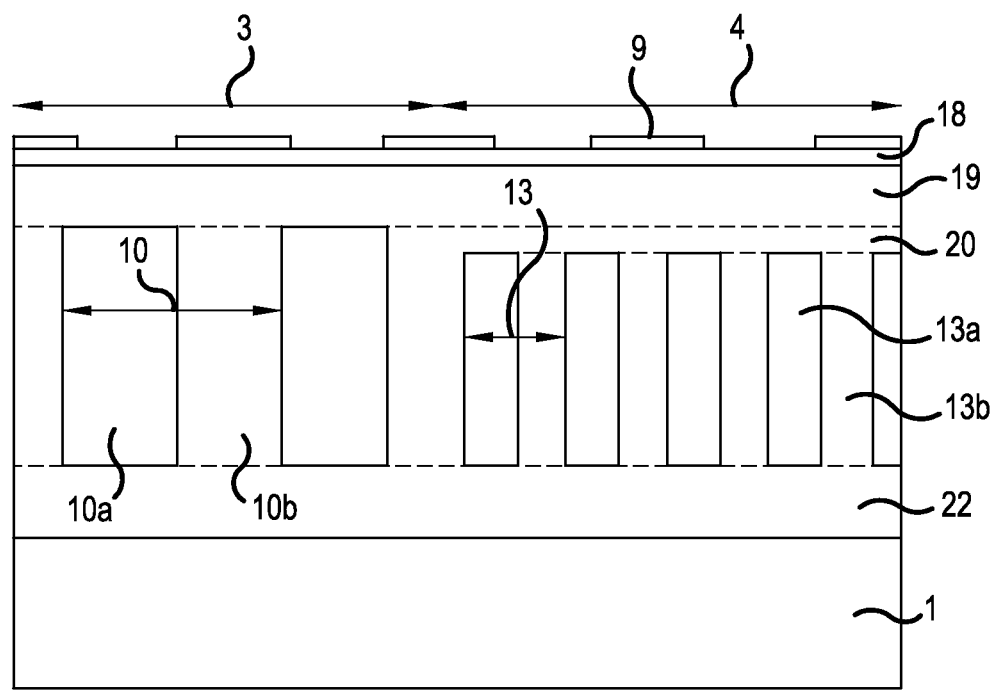
FIGS. 19A and 19B are sectional views showing manufacturing steps according to an embodiment of the invention.

As shown in FIG. 19A, the gate insulating film 18 is formed on the upper surface of the uppermost n⁻-type epitaxial layer 36, and the gate electrode 9 is formed of polysilicon on the upper surface of the gate insulating film 18.

Figure 19B:
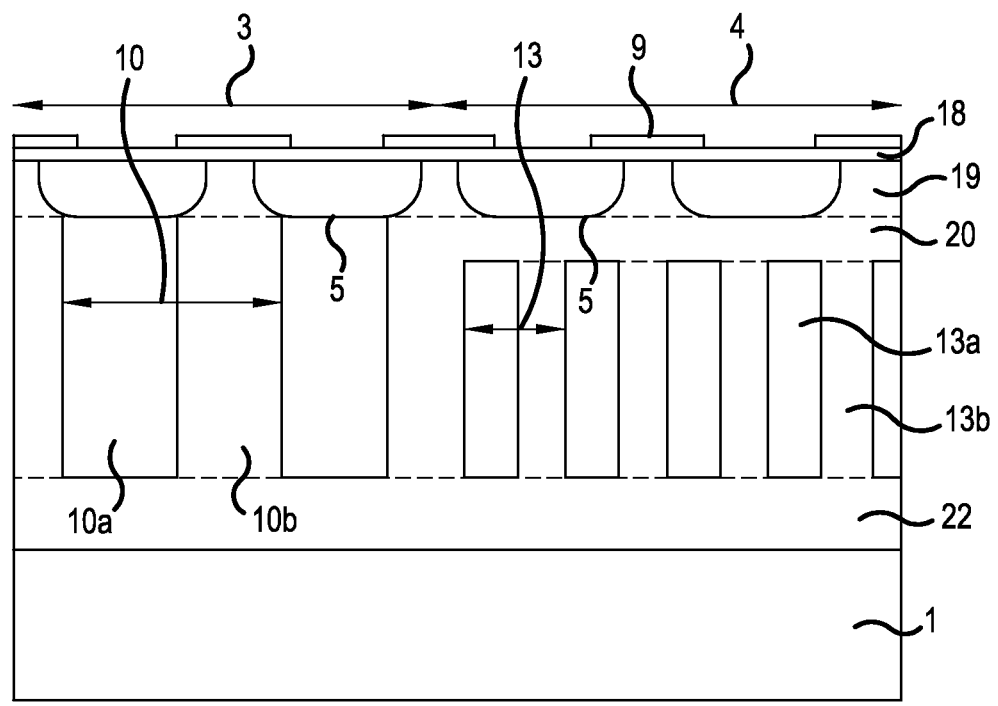

In FIG. 19B, an ion implantation is carried out with the gate electrode 9 and an unshown resist mask as a mask, thereby forming the p-type well region 5.

Figure 20A:
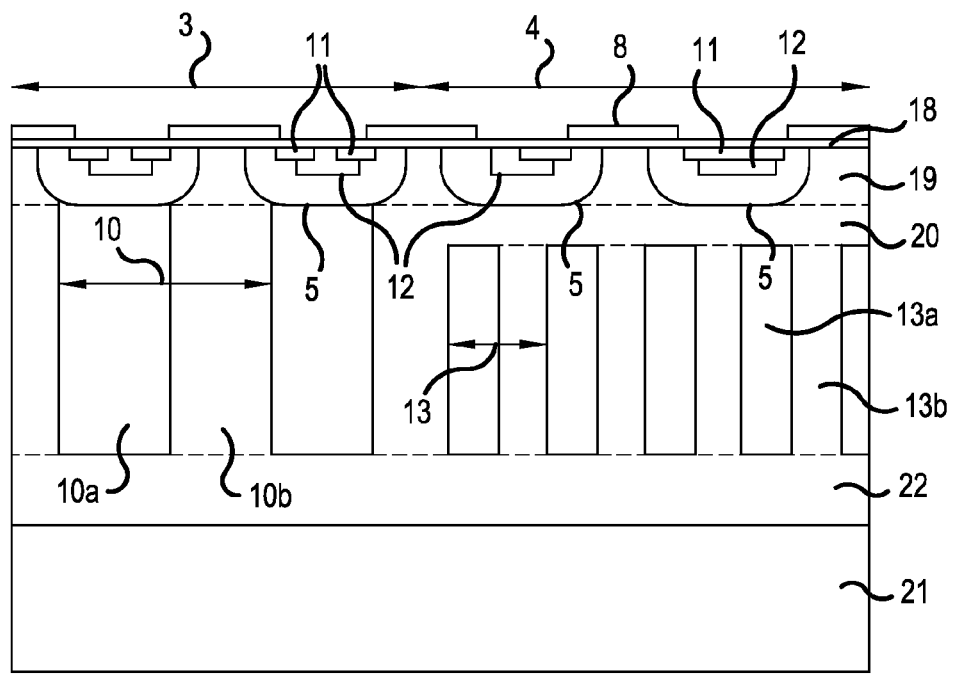
FIGS. 20A and 20B are sectional views showing manufacturing steps according to an embodiment of the invention.

In FIG. 20A, the n⁺-type source region 11 and p⁺-type contact region 12 are formed by ion implantation in a surface layer of the p-type well region 5 of the active region 3. The n⁺-type source region 11 and p⁺-type contact region 12 are formed by ion implantation in a surface layer of the p-type well region 5 of the gate pad region 4.

Figure 20B:
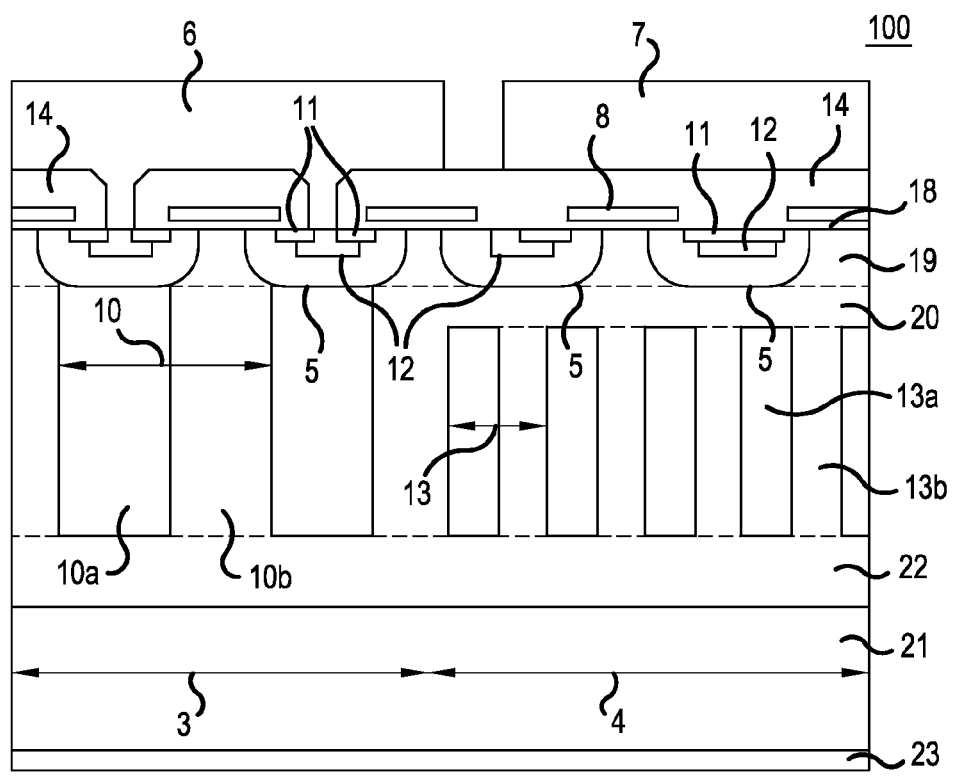

In FIG. 20B, after covering the surface with the interlayer dielectric 14 and patterning by carrying out etching with a resist mask as a mask, the source pad electrode 6, gate pad electrode 7, and gate runner 8 are formed on the interlayer dielectric 14. Also, the drain electrode 23 is formed on the other main surface of the n⁺-type substrate 31 (the back surface of the n⁺-type drain region 21). The source pad electrode 6 is formed so as to enclose the gate pad electrode 7, and is electrically connected to the n⁺-type source region 11 and p⁺-type contact region 12. The gate runner 8 is electrically connected to the gate pad electrode 7, and the gate electrode 9 is electrically connected to the gate runner 8 or gate pad electrode 7 via the contact hole 15 formed in the interlayer dielectric 14.

Twelfth Embodiment

Figure 21:
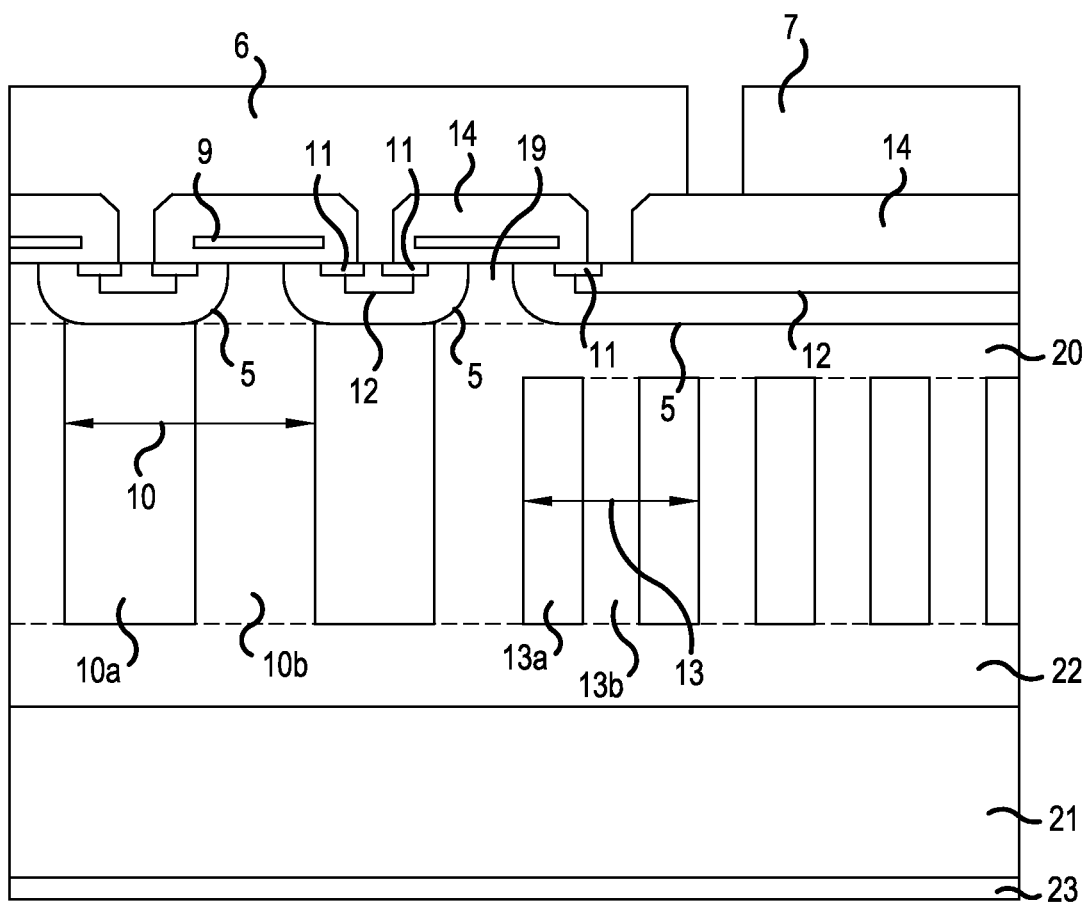
FIG. 21 is a sectional view along X-X' of FIG. 2A according to an embodiment of the invention.

FIG. 21 is a sectional view along X-X' of FIG. 2A showing a twelfth embodiment of the invention. FIG. 21 differs from the vertical semiconductor device 100 of FIG. 2B in that the p-type well region 5 under the gate pad electrode 7 is one wide region. Also, the gate electrode 9 is not formed on the upper surface of the second parallel pn layers 13. Furthermore, the n⁺-type source region 11 formed in the one p-type well region below the gate pad electrode 7 is electrically connected to the source pad electrode 6. As there are less of the channel inversion layer 17 formed in the p-type well region 5 below the gate pad electrode 7, the on-state resistance rises somewhat in comparison with the vertical semiconductor device 100 of FIG. 2B. However, it is possible to achieve a reduction in on-state resistance in comparison with the existing vertical semiconductor device 500 by disposing the n⁻-type isolation region 20. Also, as there is a decrease in the junction area of the parasitic diode configured of the p-n junction of the p-type well region 5 of the gate pad electrode 7 and the first n⁻-type drift region 19 and n⁻-type isolation region 20, it is possible to achieve an increase in reverse recovery withstand.

Thirteenth Embodiment

Figure 22:
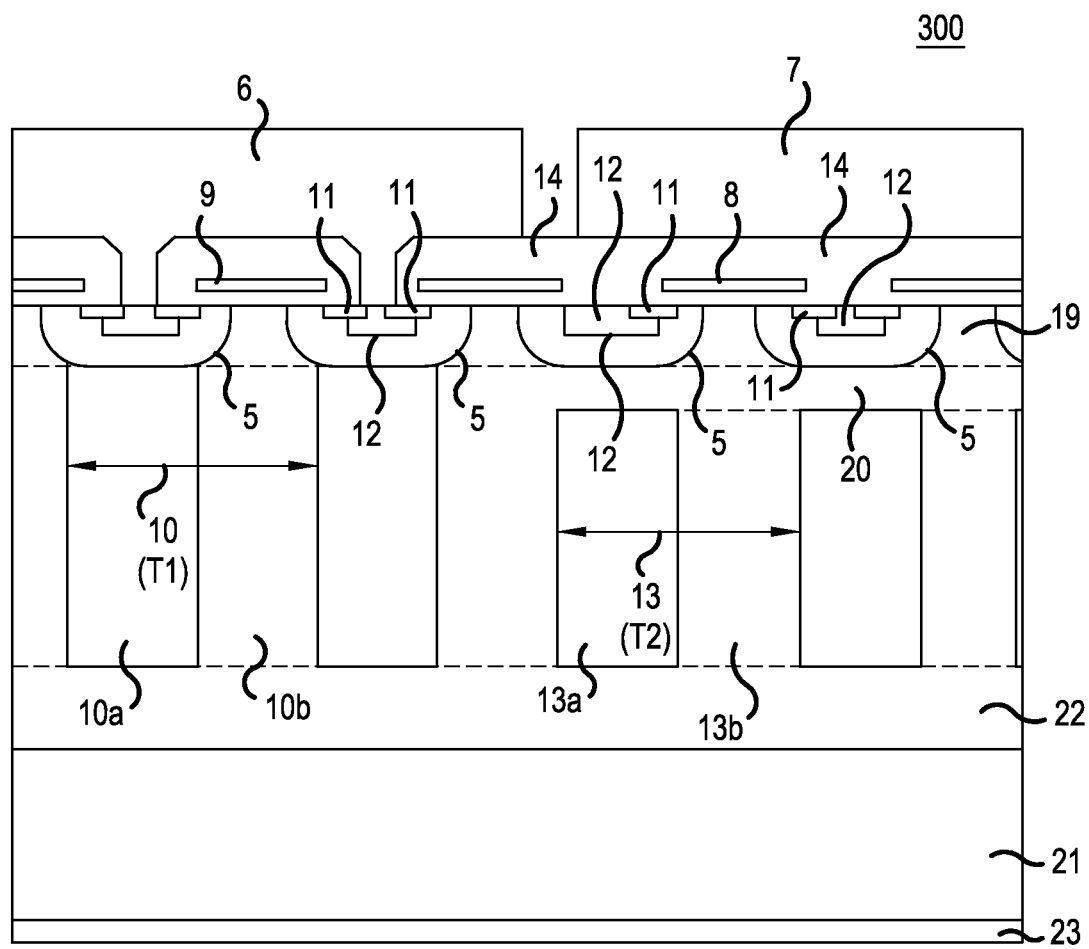
FIG. 22 is a sectional view along X-X' of FIG. 2A according to an embodiment of the invention.

FIG. 22 is a sectional view along X-X' of FIG. 2A showing a thirteenth embodiment of the invention. FIG. 22 differs from the vertical semiconductor device 100 of FIG. 2B in that the repetition pitch T2 of the second p-type partition region 13a and second n-type drift region 13b of the second parallel pn layers 13 is the same as the repetition pitch T1 of the first p-type partition region 10a and first n-type drift region 10b of the first parallel pn layers 10. In this case, it is possible to achieve a reduction in on-state resistance in comparison with the existing vertical semiconductor device 500 by disposing the n⁻-type isolation region 20. Also, as it is possible to reduce the junction area of the parasitic diode configured of the p-n junction of the p-type well region 5 of the gate pad electrode 7 and the first n⁻-type drift region 19 and n⁻-type isolation region 20, it is possible to achieve an increase in reverse recovery withstand.

Fourteenth Embodiment

Figure 23:
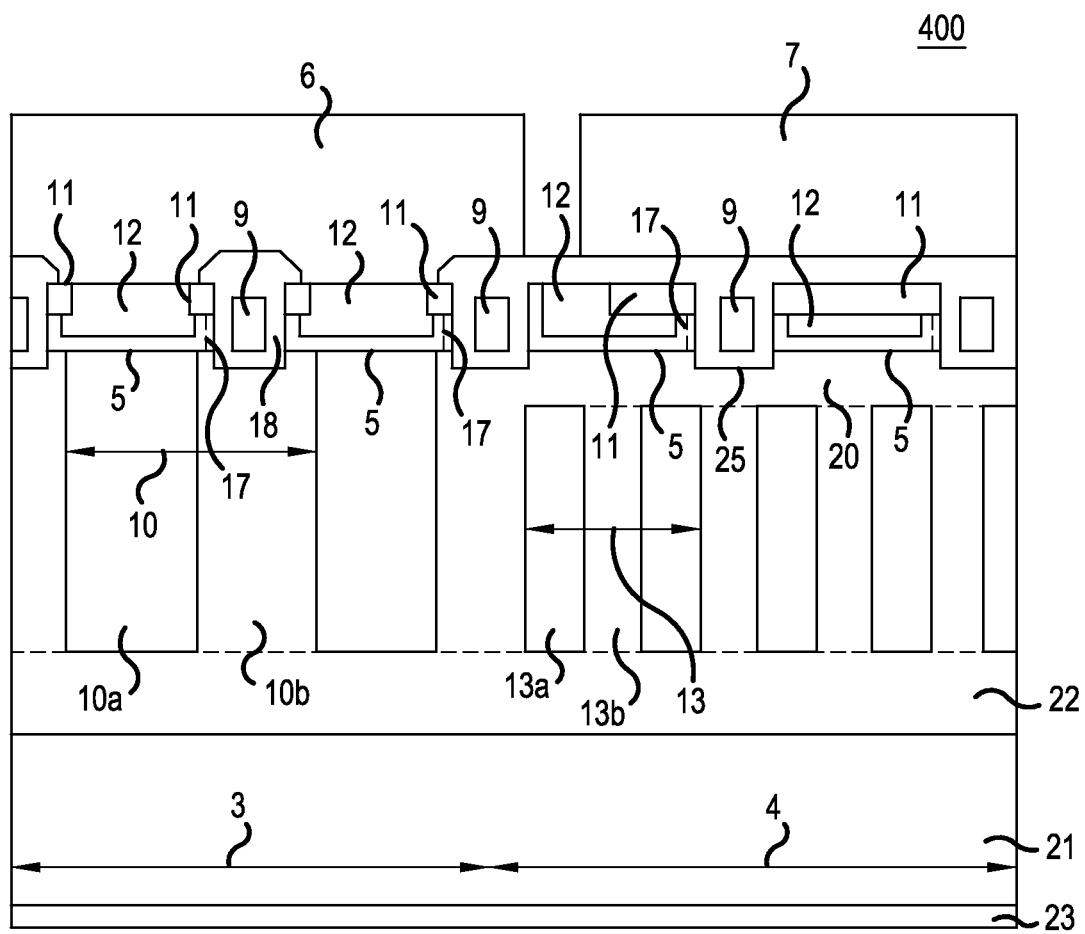
FIG. 23 is a sectional view along X-X' of FIG. 2A according to an embodiment of the invention.

FIG. 23 is a sectional view along X-X' of FIG. 2A showing a fourteenth embodiment of the invention. FIG. 23 differs from the vertical semiconductor device 100 of FIG. 2B in that the gate structure is a trench type rather than a planar type.

A trench 25 is disposed penetrating the p-type well region 5 from a surface layer of the p-type well region 5 and reaching the first n-type drift region 10b and n⁻-type isolation region 20. The n⁺-type source region 11 is formed in a surface layer of the p-type well region 5. The p⁺-type contact region 12 is disposed so as to be in contact with the n⁺-type source region 11 inside the p-type well region 5. The polysilicon gate electrode 9 is disposed across the gate insulating film 18 on an inner wall of the trench 25. The channel inversion layer 17 is formed in a direction (the vertical direction in the drawing) following the gate insulating film 18 formed in the trench 25 in the p-type well region 5 sandwiched between the n⁺-type source region 11 and the first n-type drift region 10b and n⁻-type isolation region 20

By adopting a trench structure, refining the cell pitch becomes easier, and it is possible to reduce the pitch dimensions of the vertical semiconductor device 100 of FIG. 1 to in the region of one-fifth.

Fifteenth Embodiment

Figure 24:
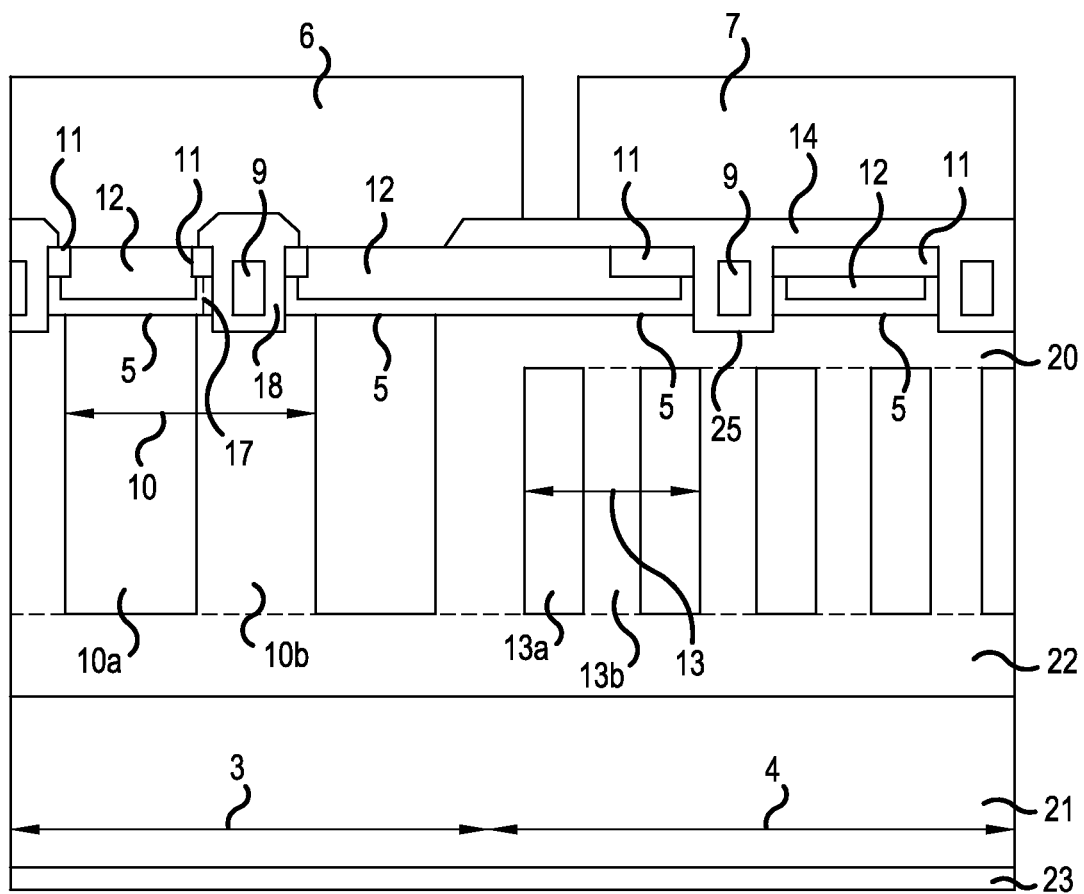
FIG. 24 is a sectional view along X-X' of FIG. 2A according to an embodiment of the invention.

FIG. 24 is a sectional view along X-X' of FIG. 2A showing a fifteenth embodiment of the invention.

In the fourteenth embodiment, the channel inversion layer 17 is formed under the vicinity of the place in which the interlayer dielectric 14 is exposed, because of which there is a possibility of fluctuation in the gate threshold voltage occurring. The fifteenth embodiment of the invention prevents this.

FIG. 24 differs from FIG. 23 in that the trench 25 is not disposed below the place between the source pad electrode 6 and gate pad electrode 7 in which the interlayer dielectric 14 is exposed. The channel inversion layer 17 is formed in a direction following the gate insulating film 18 formed in the trench 25 in the p-type well region 5 formed straddling a portion below the source pad electrode 6 and a portion below the gate pad electrode 7. However, the channel inversion layer 17 is not formed below the place between the source pad electrode 6 and gate pad electrode 7 in which the interlayer dielectric 14 is exposed. Therefore, no fluctuation occurs in the gate threshold voltage when ions or the like are introduced from the exterior into the gate insulating film 18 via the interlayer dielectric 14, even when, for example, hydrogen ions, sodium ions, chlorine ions, or the like, contained in the moisture of the external peripheral atmosphere are introduced. Because of this, there is less fluctuation in switching characteristics and on-state characteristics than in the case of the vertical semiconductor device 400 shown in FIG. 23, because of which the vertical semiconductor device can be caused to operate stably.

What is claimed is:

1. A vertical semiconductor device comprising an element active portion and a voltage withstanding structure portion,
    the element active portion including:
    a first conductivity type first semiconductor layer;
    a drift layer disposed on a first main surface of the first semiconductor layer;
    a first conductivity type second semiconductor layer disposed in a surface layer of the drift layer;
    a second conductivity type well region disposed in a surface layer of the second semiconductor layer;
    a first conductivity type source region disposed in a surface layer of the well region;
    a second conductivity type contact region disposed in a surface layer of the well region;
    a gate electrode disposed across a gate insulating film above the well region sandwiched between the source region of the well region and the second semiconductor layer;
    an interlayer dielectric disposed on the upper surface of the gate electrode;
    a first main electrode electrically connected to the source region and contact region on the upper surface of the interlayer dielectric; and
    a gate pad electrode, to which the gate electrode is electrically connected, disposed separated from the first main electrode on the upper surface of the interlayer dielectric, wherein
    the drift layer below the first main electrode includes first parallel pn layers wherein a first first conductivity type semiconductor region and first second conductivity type semiconductor region are repeatedly alternately disposed in a direction parallel to the first main surface and the first second conductivity type semiconductor region is in contact with the well region,
    the drift layer below the gate pad electrode includes second parallel pn layers wherein a second first conductivity type semiconductor region and second second conductivity type semiconductor region are repeatedly alternately disposed in a direction parallel to the first main surface and the second second conductivity type semiconductor region is disposed so as to oppose the well region,
    a first conductivity type isolation region is included between the second parallel pn layers and the well region,
    the planar form of the gate electrode is a stripe form,
    the source region immediately below a first position between an end portion of the first main electrode disposed in a direction parallel to the longitudinal direction of the stripe form the gate electrode and an end portion of the gate pad electrode, and immediately below the first main electrode and the gate pad electrode adjacent to the first position, is separated from the gate electrode by a space, and
    the source region disposed immediately below a second position between an end portion of the first main electrode disposed in a direction perpendicular to the longitudinal direction of the stripe form gate electrode and an end portion of the gate pad electrode, and immediately below the first main electrode and the gate pad electrode adjacent to the second position, is separated from the gate electrode by a space.

2. The vertical semiconductor device according to claim 1, wherein the repetition pitch of the second parallel pn layers wherein the second first conductivity type semiconductor region and second second conductivity type semiconductor region are repeatedly alternately disposed is shorter than the repetition pitch of the first parallel pn layers wherein the first first conductivity type semiconductor region and first second conductivity type semiconductor region are repeatedly alternately disposed.

3. The vertical semiconductor device according to claim 1, wherein the repetition pitch of the second parallel pn layers wherein the second first conductivity type semiconductor region and second second conductivity type semiconductor region are repeatedly alternately disposed is equal to the repetition pitch of the first parallel pn layers wherein the first first conductivity type semiconductor region and first second conductivity type semiconductor region are repeatedly alternately disposed.

4. The vertical semiconductor device according to claim 1, wherein the thickness from the upper surface of the second semiconductor layer to the upper surface of the second parallel pn layers is one-third or less of the thickness from the upper surface of the second semiconductor layer to the lower surface of the second parallel pn layers.

5. The vertical semiconductor device according to claim 1, wherein a gate runner connecting the gate electrode and gate pad electrode is disposed on the first main surface of the first main electrode, and
    the source region disposed immediately below a third position between an end portion of the first main electrode disposed in a direction perpendicular to the longitudinal direction of the stripe form gate electrode and an end portion of the gate runner, and below the first main electrode and the gate pad electrode adjacent to the third position, is separated from the gate electrode via space.

6. The vertical semiconductor device according to claim 1, wherein the source region disposed immediately below the first position and immediately below the first mail electrode and the gate pad electrode adjacent to the first position, and the source region disposed immediately below the second position and immediately below the first main electrode and the gate pad electrode adjacent to the second position, include a depressed portion of which width in a direction perpendicular to the longitudinal direction of the stripe form gate electrode is narrower, and
    the distance from one side surface of the depressed portion parallel to a direction perpendicular to the longitudinal direction of the stripe form gate electrode to the end portion of the first main electrode and the distance from the other side surface of the depressed portion parallel to a direction perpendicular to the longitudinal direction of the stripe form gate electrode to the end portion of the gate pad electrode are 2 μm or more.

7. The vertical semiconductor device according to claim 1, wherein the stripe form gate electrode is isolated between a portion below the first main electrode and a portion below the gate pad electrode.

8. The vertical semiconductor device according to claim 1, wherein the second conductivity type well region disposed immediately below a space between an end portion of the first main electrode disposed in a direction perpendicular to the longitudinal direction of the stripe form gate electrode and an end portion of the gate pad electrode is such that neighboring second conductivity type well regions are coupled, and the gate electrode is not disposed immediately below the space between the end portion of the first main electrode and the end portion of the gate pad electrode.

9. The vertical semiconductor device according to claim 1, wherein the second conductivity type well region disposed immediately below the gate pad electrode is one coupled second conductivity type well region.

10. The vertical semiconductor device according to claim 1, wherein the planar form of the first parallel pn layers is a stripe form extending in a direction perpendicular to the direction in which the first first conductivity type semiconductor region and first second conductivity type semiconductor region are repeatedly alternately disposed.

11. The vertical semiconductor device according to claim 1, wherein the planar form of the second parallel pn layers is a stripe form extending in a direction perpendicular to the direction in which the second first conductivity type semiconductor region and second second conductivity type semiconductor region are repeatedly alternately disposed.

12. The vertical semiconductor device according to claim 1, wherein the planar form of the second parallel pn layers is a lattice form.

13. The vertical semiconductor device according to claim 1, including an impurity concentration bias wherein the impurity concentration of the first second conductivity type semiconductor region and second second conductivity type semiconductor region is high on the first main surface side of the drift layer, and the impurity concentration of the first first conductivity type semiconductor region and second first conductivity type semiconductor region is high on a second main surface side of the drift layer.

14. The vertical semiconductor device according to claim 1, including a first conductivity type low resistance layer between the first semiconductor layer and the first parallel pn layers and second parallel pn layers.

15. The vertical semiconductor device according to claim 1, including a second main electrode on a second main surface of the first semiconductor layer.

16. A method of manufacturing the vertical semiconductor device according to claim 1, the vertical semiconductor device manufacturing method comprising:
a step of epitaxially growing a first conductivity type resistance layer on a first main surface of a first conductivity type semiconductor substrate and selectively ion implanting a first conductivity type impurity and second conductivity type impurity into the surface of the first conductivity type resistance layer; and
a stacking step of repeating multiple times
a layer formation step of epitaxially growing a first conductivity type epitaxial layer on the surface of the first conductivity type resistance layer and selectively ion implanting the first conductivity type impurity and second conductivity type impurity into the surface of the first conductivity type epitaxial layer, and a step of epitaxially growing the first conductivity type epitaxial layer on the surface of the first conductivity type epitaxial layer and selectively ion implanting the first conductivity type impurity and second conductivity type impurity into the surface of the first conductivity type epitaxial layer, wherein
there is no selective ion implantation of the first conductivity type impurity and second conductivity type impurity in the stacking step into a place in which the first conductivity type isolation region is formed.

17. The vertical semiconductor device according to claim 11, wherein the longitudinal direction of the stripes of the planar form of the first parallel pn layers and the longitudinal direction of the stripes of the planar form of the second parallel pn layers are parallel.

18. A vertical semiconductor device comprising an element active portion and a voltage withstanding structure portion,
the element active portion including:
a first conductivity type first semiconductor layer;
a drift layer disposed on a first main surface of the first semiconductor layer;
a second conductivity type well region disposed in a surface layer of the drift layer;
a first conductivity type source region disposed in a surface layer of the well region;
a second conductivity type contact region disposed in a surface layer of the well region;
a trench disposed in a surface layer of the well region;
a gate electrode disposed across a gate insulating film in the trench;
an interlayer dielectric disposed on the upper surface of the gate electrode;
a first main electrode electrically connected to the source region and contact region on the upper surface of the interlayer dielectric; and
a gate pad electrode, to which the gate electrode is electrically connected, disposed separated from the first main electrode on the upper surface of the interlayer dielectric, wherein
the drift layer below the first main electrode includes first parallel pn layers wherein a first first conductivity type semiconductor region and first second conductivity type semiconductor region are repeatedly alternately disposed in a direction parallel to the first main surface and the first second conductivity type semiconductor region is in contact with the well region,
the drift layer below the gate pad electrode includes second parallel pn layers wherein a second first conductivity type semiconductor region and second second conductivity type semiconductor region are repeatedly alternately disposed in a direction parallel to the first main surface and the second second conductivity type semiconductor region is disposed so as to oppose the well region,
the planar form of the gate electrode is a stripe form,
the source region immediately below a first position between an end portion of the first main electrode disposed in a direction parallel to the longitudinal direction of the stripe form gate electrode and an end portion of the gate pad electrode, and immediately below the first main electrode and the gate pad electrode adjacent to the first position, is separated from the gate electrode by a space, the source region disposed immediately below a second position between an end portion of the first main electrode disposed in a direction perpendicular to the longitudinal direction of the stripe form gate electrode and an end portion of the gate pad electrode, and immediately below the first main electrode and the gate pad electrode adjacent to the second position, is separated from the gate electrode by a space, a first conductivity type isolation region is included between the second parallel pn layers and the well region, and the trench reaches the first first conductivity type semiconductor region and the first conductivity type isolation region.

19. The vertical semiconductor device according to claim 18, wherein the trench is not disposed below a space between the first main electrode and gate pad electrode.

20. The vertical semiconductor device according to claim 18, including a first conductivity type low resistance layer between the first semiconductor layer and the first parallel pn layers and second parallel pn layers.

21. The vertical semiconductor device according to claim 18, wherein the stripe form gate electrode is isolated between a portion below the first main electrode and a portion below the gate pad electrode.

22. The vertical semiconductor device according to claim 20, including a first conductivity type low resistance layer between the first semiconductor layer and the first parallel pn layers and second parallel pn layers.

23. A vertical semiconductor device comprising an element active portion and a voltage withstanding structure portion, the element active portion including:

a first conductivity type first semiconductor layer;

a drift layer disposed on a first main surface of the first semiconductor layer;

a first conductivity type second semiconductor layer disposed in a surface layer of the drift layer;

a second conductivity type well region disposed in a surface layer of the second semiconductor layer;

a first conductivity type source region disposed in a surface layer of the well region;

a second conductivity type contact region disposed in a surface layer of the well region;

a gate electrode disposed across a gate insulating film above the well region sandwiched between the source region of the well region and the second semiconductor layer;

an interlayer dielectric disposed on the upper surface of the gate electrode;

a first main electrode electrically connected to the source region and contact region on the upper surface of the interlayer dielectric; and a gate pad electrode, to which the gate electrode is electrically connected, disposed separated from the first main electrode on the upper surface of the interlayer dielectric, wherein the drift layer below the first main electrode includes first parallel pn layers wherein a first first conductivity type semiconductor region and first second conductivity type semiconductor region are repeatedly alternately disposed in a direction parallel to the first main surface and the first second conductivity type semiconductor region is in contact with the well region, the drift layer below the gate pad electrode includes second parallel pn layers wherein a second first conductivity type semiconductor region and second second conductivity type semiconductor region are repeatedly alternately disposed in a direction parallel to the first main surface and the second second conductivity type semiconductor region is disposed so as to oppose the well region, a first conductivity type isolation region is included between the second parallel pn layers and the well region, the planar form of the gate electrode is a stripe form, the source region immediately below a first position between an end portion of the first main electrode disposed in a direction parallel to the longitudinal direction of the stripe form gate electrode and an end portion of the gate pad electrode, and immediately below the first main electrode and the gate pad electrode adjacent to the first position, is separated from the gate electrode by a space, and a gate runner connecting the gate electrode and gate pad electrode is disposed on the first main surface of the first main electrode, the source region disposed immediately below a second position between an end portion of the first main electrode disposed in a direction perpendicular to the longitudinal direction of the stripe form gate electrode and an end portion of the gate runner, and immediately below the first main electrode and the gate runner adjacent to the second position, is separated from the gate electrode by a space.

24. The vertical semiconductor device according to claim 23, wherein the source region disposed immediately below the first position and immediately below the first main electrode and the gate pad electrode adjacent to the first position, and the source region disposed immediately below the second position and immediately below the first main electrode and the gate runner electrode adjacent to the second position, include a depressed portion of which width in a direction perpendicular to the longitudinal direction of the stripe form gate electrode is narrower, and the distance from one side surface of the depressed portion parallel to a direction perpendicular to the longitudinal direction of the stripe form gate electrode to the end portion of the first main electrode and the distance from the other side surface of the depressed portion parallel to a direction perpendicular to the longitudinal direction of the stripe form gate electrode to the end portion of the gate pad electrode are separated 2 μm or more.

25. A vertical semiconductor device comprising an element active portion and a voltage withstanding structure portion, the element active portion including:

a first conductivity type first semiconductor layer;

a drift layer disposed on a first main surface of the first semiconductor layer;

a second conductivity type well region disposed in a surface layer of the drift layer;

a first conductivity type source region disposed in a surface layer of the well region;

a second conductivity type contact region disposed in a surface layer of the well region;

a trench disposed in a surface layer of the well region;

a gate electrode disposed across a gate insulating film in the trench;

an interlayer dielectric disposed on the upper surface of the gate electrode;

a first main electrode electrically connected to the source region and contact region on the upper surface of the interlayer dielectric; and a gate pad electrode, to which the gate electrode is electrically connected, disposed separated from the first main electrode on the upper surface of the interlayer dielectric, wherein the drift layer below the first main electrode includes first parallel pn layers wherein a first first conductivity type semiconductor region and first second conductivity type semiconductor region are repeatedly alternately disposed in a direction parallel to the first main surface and the first second conductivity type semiconductor region is in contact with the well region, the drift layer below the gate pad electrode includes second parallel pn layers wherein a second first conductivity type semiconductor region and second second conductivity type semiconductor region are repeatedly alternately disposed in a direction parallel to the first main surface and the second second conductivity type semiconductor region is disposed so as to oppose the well region, the planar form of the gate electrode is a stripe form, the source region immediately below a first position between an end portion of the first main electrode disposed in a direction parallel to the longitudinal direction of the stripe form gate electrode and an end portion of the gate pad electrode, and immediately below the first main electrode and the gate pad electrode adjacent to the first position, is separated from the gate electrode by a space, a gate runner connecting the gate electrode and gate pad electrode is disposed on the first main surface of the first main electrode, the source region disposed immediately below a second position between an end portion of the first main electrode disposed in a direction perpendicular to the longitudinal direction of the stripe form gate electrode and an end portion of the gate runner, and immediately below the first main electrode and the gate runner adjacent to the second position, is separated from the gate electrode by a space, a first conductivity type isolation region is included between the second parallel pn layers and the well region, and the trench reaches the first first conductivity type semiconductor region and the first conductivity type isolation region.

26. The vertical semiconductor device according to claim 25, including a first conductivity type low resistance layer between the first semiconductor layer and the first parallel pn layers and second parallel pn layers.

27. The vertical semiconductor device according to claim 25, wherein the stripe form gate electrode is isolated between a portion below the first main electrode and a portion below the gate pad electrode.

\* \* \* \* \*